(12) United States Patent
Sriram et al.

(10) Patent No.: US 11,244,831 B2
(45) Date of Patent: Feb. 8, 2022

(54) DEPLETION MODE SEMICONDUCTOR DEVICES INCLUDING CURRENT DEPENDENT RESISTANCE

(71) Applicant: Wolfspeed, Inc., Durham, NC (US)

(72) Inventors: Saptharishi Sriram, Cary, NC (US); Yueying Liu, Morrisville, NC (US)

(73) Assignee: Wolfspeed, Inc., Durham, NC (US)

( * ) Notice: Subject to any disclaimer, the term of this patent is extended or adjusted under 35 U.S.C. 154(b) by 0 days.

(21) Appl. No.: 16/502,771

(22) Filed: Jul. 3, 2019

(65) Prior Publication Data
US 2019/0333767 A1 Oct. 31, 2019

Related U.S. Application Data

(63) Continuation of application No. 15/613,328, filed on Jun. 22, 2017, now Pat. No. 10,354,879.

(60) Provisional application No. 62/354,321, filed on Jun. 24, 2016.

(51) Int. Cl.
| | | |
|---|---|---|
| H01L 21/266 | (2006.01) | |
| H01L 29/778 | (2006.01) | |
| H01L 29/20 | (2006.01) | |
| H01L 29/08 | (2006.01) | |
| H01L 21/265 | (2006.01) | |
| H01L 29/417 | (2006.01) | |
| H01L 29/423 | (2006.01) | |

(52) U.S. Cl.
CPC ........ *H01L 21/266* (2013.01); *H01L 29/0843* (2013.01); *H01L 29/2003* (2013.01); *H01L 29/7786* (2013.01); *H01L 21/26546* (2013.01); *H01L 21/26586* (2013.01); *H01L 29/41766* (2013.01); *H01L 29/42316* (2013.01)

(58) Field of Classification Search
CPC ....... H01L 21/26; H01L 21/266; H01L 29/08; H01L 29/0843; H01L 29/20; H01L 29/2003; H01L 29/77; H01L 29/778; H01L 29/7786
USPC .......................................................... 257/76
See application file for complete search history.

(56) References Cited

U.S. PATENT DOCUMENTS

| | | | |
|---|---|---|---|
| 6,316,793 | B1 | 11/2001 | Sheppard et al. |
| 7,812,369 | B2 | 10/2010 | Chini et al. |
| 7,906,799 | B2 | 3/2011 | Sheppard et al. |
| 2002/0066908 | A1 | 6/2002 | Smith |
| 2002/0167023 | A1 | 11/2002 | Chavarkar et al. |
| 2004/0061129 | A1 | 4/2004 | Saxler et al. |
| 2005/0087763 | A1* | 4/2005 | Kanda ............... H01L 27/14636 257/192 |
| 2006/0106606 | A1 | 5/2006 | Saxx |
| 2007/0158683 | A1 | 7/2007 | Sheppard |

(Continued)

*Primary Examiner* — Fazli Erdem
(74) *Attorney, Agent, or Firm* — Sage Patent Group

(57) ABSTRACT

A transistor device is provided. The transistor device includes a substrate, a channel layer on the substrate, the channel layer including a GaN material, a barrier layer that is on the channel layer and that includes an AlGaN material, a drain electrode that is on the barrier layer in a drain region of the device, a source ohmic structure that is at least partially recessed into the barrier layer in a source region of the device, a source electrode that is on the source ohmic structure and a gate contact that is on the barrier layer and that is in a gate region of the device that is between the drain region and the source region.

46 Claims, 11 Drawing Sheets

(56) References Cited

U.S. PATENT DOCUMENTS

| | | | |
|---|---|---|---|
| 2007/0269968 A1* | 11/2007 | Saxler | H01L 29/66462 |
| | | | 438/522 |
| 2008/0029812 A1 | 2/2008 | Bhalla | |
| 2008/0121895 A1 | 5/2008 | Sheppard | |
| 2008/0166849 A1 | 7/2008 | Yang | |
| 2008/0182394 A1 | 7/2008 | Yang | |
| 2008/0237640 A1* | 10/2008 | Mishra | H01L 29/7786 |
| | | | 257/194 |
| 2008/0258150 A1* | 10/2008 | McCarthy | H01L 29/66462 |
| | | | 257/76 |
| 2008/0272408 A1 | 11/2008 | Vora | |
| 2008/0290371 A1 | 11/2008 | Sheppard | |
| 2010/0327322 A1* | 12/2010 | Kub | H01L 29/205 |
| | | | 257/194 |
| 2011/0057232 A1* | 3/2011 | Sheppard | H01L 29/7787 |
| | | | 257/194 |
| 2011/0092057 A1 | 4/2011 | Suvarov | |
| 2011/0284865 A1 | 11/2011 | Inoue | |
| 2012/0012930 A1 | 1/2012 | Sato | |
| 2012/0205738 A1 | 8/2012 | Yang | |
| 2013/0026568 A1 | 1/2013 | Bhalla | |
| 2013/0153967 A1 | 6/2013 | Curatola | |
| 2014/0264379 A1* | 9/2014 | Kub | H01L 29/66477 |
| | | | 257/77 |
| 2014/0264454 A1* | 9/2014 | Banerjee | H01L 29/402 |
| | | | 257/194 |
| 2014/0329367 A1 | 11/2014 | Sheppard et al. | |
| 2015/0028350 A1 | 1/2015 | Suvorov | |
| 2015/0137135 A1 | 5/2015 | Green | |
| 2016/0197203 A1* | 7/2016 | Hu | H01L 29/872 |
| | | | 257/76 |
| 2017/0110598 A1* | 4/2017 | Chen | H01L 29/66143 |
| 2017/0278961 A1* | 9/2017 | Hill | H01L 29/66462 |

\* cited by examiner

DEPLETION MODE SEMICONDUCTOR DEVICES INCLUDING CURRENT DEPENDENT RESISTANCE

RELATED APPLICATIONS

This application is a Continuation of U.S. patent application Ser. No. 15/613,328 filed Jun. 22, 2017, which in turn claims priority to Provisional U.S. Patent Application No. 62/354,321 filed on Jun. 24, 2016, the entire content and disclosure of which are herein incorporated by reference in their entirety.

FIELD

Various embodiments described herein relate to power semiconductor devices and, more particularly, to circuits and operating methods for power semiconductor devices.

BACKGROUND

Power semiconductor devices are widely used to carry large currents, support high voltages and/or operate at high frequencies such as radio frequencies. A wide variety of power semiconductor devices are known in the art including, for example, High Electron Mobility Transistors (HEMT) and Metal Semiconductor Field Effect Transistors (MESFETs). Modern power semiconductor devices are generally fabricated from wide bandgap semiconductor materials. For example, HEMTs may be fabricated from silicon or, more recently, from gallium nitride (GaN) material systems on a silicon carbide (SiC) substrate. The power device may be marketed as a discrete power device or may be integrated in a Monolithic Microwave Integrated Circuit (MMIC). An overview of GaN-on-SiC HEMTs and MMICs may be found in the invited paper entitled "*A Review of GaN on SiC High Electron-Mobility Power Transistors and MMICs*" by Pengelly et al., *IEEE Transactions on Microwave Theory and Techniques*, Vol. 60, No. 6, June 2012, pp. 1764-1783.

Field effect transistors may be classified into depletion mode and enhancement mode types, corresponding to whether the transistor is in an ON-state or an OFF-state at zero gate voltage. In enhancement mode devices, the devices are OFF at zero gate voltage, whereas in depletion mode devices, the device is ON at zero gate voltage. HEMTs and MESFETs are typically depletion mode devices, in that they are conductive at zero gate bias due to the polarization-induced charge at a barrier/channel interface. Examples of such depletion mode devices include gallium arsenide (GaAs) MESFETs, GaAs pHEMTs and GaN HEMTs. Depletion mode GaN HEMTs that are marketed by Cree, Inc. are described in the following data sheets: "*CMPA2735075D—75 W, 2.7-3.5 GHz, GaN MMIC, Power Amplifier*" (Rev 1.1—April 2012); "*CMPA0060025D—25 W, 20 MHz-6.0 GHz, GaN MMIC, Power Amplifier*" (Rev 1.2—December 2014); "*CMPA1D1E025F—25 W, 13.75-14.5 GHz, 40 V, Ku-Band GaN MMIC, Power Amplifier*" (Rev 0.0—March 2015); "*CMPA801B025D—25 W, 8.0-11.0 GHz, GaN MMIC, Power Amplifier*" (Rev 1.0—June 2014); "*CMPA2560025D—25 W, 2.5-6.0 GHz, GaN MMIC, Power Amplifier*" (Rev 1.3—September 2012); "*CMPA1D1E030D—30 W, 13.75-14.5 GHz, 40 V, GaN MMIC, Power Amplifier*" (Rev 0.0—April 2015); and "*CMPA5585025F—25 W, 5.5-8.5 GHz, GaN MMIC, Power Amplifier*" (Rev 3.2—March 2015). Other depletion mode power devices may also be provided, such as depletion mode power Metal Oxide Semiconductor Field Effect Transistors (MOSFETs) or Junction Field Effect Transistors (JFETs).

Sheet resistance of a GaN HEMT may be dependent on drain current. This dependence may be due to the quasi saturation of electron velocity. As such, the source sheet resistance may be dependent on drain current. For example, brief reference is now made to FIG. 1, which is a plot that illustrates GaN source sheet resistance as a function of current. In some embodiments, testing dynamic source resistance may vary from 0.4 ohms at low drain currents to 2.2 ohms at higher drain currents, such as, for example, 1 A/mm. As such the dynamic source resistance may provide a significant source of non-linearity. The non-linearity may provide that signals at more than one frequency may mix together to generate cumulative signals at unwanted frequencies.

One conventional approach to addressing the effects of the dynamic source resistance may be to reduce the magnitude by reducing the gate-source spacing, using, for example, self-aligned structures. However, such approaches may present other problems including, for example, lower breakdown voltages.

SUMMARY

Embodiments of the present invention include transistor devices. Such transistor devices may include a channel layer including a first surface and a second surface that is opposite the first surface, and an epitaxial layer structure including a barrier layer that includes a first surface and a second surface that is opposite the first surface, wherein an interface between the first surface of the barrier layer and the second surface of the channel layer induces a two dimensional electron gas in the channel layer. Devices may include a cap layer on the second surface of the barrier layer and a graded region that is implanted below the second surface of the barrier layer and that extends from a source region or a drain region of the device into a gate region of the device, the graded region including conductivity transition values between a first conductivity the source region or the drain region to a second conductivity in the gate region, wherein the first conductivity is different from the second conductivity.

In some embodiments, the graded region is generated using an angular implantation. Some embodiments provide that the graded region is generated using a substantially orthogonal implantation and a sloped implantation mask. In some embodiments, the graded region extends from the source region to the gate region, wherein the first conductivity comprises an n+ conductivity in the source region and the second conductivity comprises an n- conductivity in the gate region.

In some embodiments, the graded region extends from the drain region to the gate region and the first conductivity comprises an n+ conductivity in the drain region and the second conductivity comprises an n- conductivity in the gate region.

Some embodiments provide that the graded region includes a first surface that is at a same height as the second surface of the barrier layer relative to the first surface of the channel layer. In some embodiments, the graded region extends partially through the barrier layer and includes a second surface that is opposite the first surface and a portion of the barrier layer is between the second surface of the graded region and the first surface of the barrier layer. Some embodiments provide that the graded region extends through the barrier layer and includes a second surface that is opposite the first surface and that is at a same height as the first surface of the barrier layer relative to the first surface of the channel layer.

In some embodiments, the graded region includes a first surface that is lower than the second surface of the barrier layer relative to the first surface of the channel layer. Some embodiments provide that the graded region extends partially through the channel layer and includes a second surface that is opposite the first surface and a portion of the channel layer is below the second surface of the graded region relative to the first surface of the channel layer. In some embodiments, the graded region extends from a height that is higher than the two dimensional electron gas to a height that is lower than the two dimensional electron gas in the channel layer relative to a first surface of the channel layer.

Some embodiments provide that the graded region comprises a first graded region that extends from the source region into the gate region of the device. The first graded region includes conductivity transition values between the first conductivity in the source region to the second conductivity in the gate region. Some embodiments provide that the device further comprises a second graded region that is implanted below the second surface of the barrier layer and that extends from the drain region of the device into the gate region of the device. The second graded region includes conductivity transition values between the first conductivity the drain region to the second conductivity in the gate region. Some embodiments provide that the first and second graded regions extend partially through the barrier layer and include respective second surfaces that are opposite respective first surfaces. In some embodiments, a portion of the barrier layer is between the respective second surfaces of the first and second graded regions and the first surface of the barrier layer.

Some embodiments provide that the first and second graded regions extend through the barrier layer and include respective second surfaces that are opposite the respective first surfaces and that are at a same height as the first surface of the barrier layer relative to the first surface of the channel layer.

In some embodiments, the first graded region includes a first thickness relative to the second surface of the channel layer, the second graded region includes a second thickness relative to the second surface of the channel layer, and the first thickness is different from the second thickness.

Some embodiments provide that the first surface of the first graded region is at a different height than the first surface of the second graded region relative to the first surface of the channel layer. In some embodiments, the second surface of the first graded region is at a different height than the second surface of the second graded region relative to the first surface of the channel layer.

In some embodiments, the graded region comprises a source ohmic structure or a drain ohmic structure.

Some embodiments provide that a dynamic source resistance that increases as a drain current increases is offset by controlling a current through the barrier layer.

In some embodiments, the barrier layer comprises an AlGaN material and the graded region includes silicon that is implanted into the barrier layer in the source region or the drain region.

Some embodiments provide a recess is etched into the cap layer in the source region or the drain region and the graded region is formed by an implantation operation after the recess is etched.

Some embodiments provide that the barrier layer includes a recess that is through the barrier layer in the source or drain region and the graded region comprises an ohmic structure that comprises a material that includes metal and contacts the channel layer at the interface between the channel layer and the barrier layer.

Some embodiments are directed to transistor devices that include a channel layer, an epitaxial layer structure including a barrier layer on the channel layer, wherein the barrier layer and the channel layer induce a two dimensional electron gas in the channel layer at an interface between the channel layer and the barrier layer, a drain electrode that is on the epitaxial structure in a drain region of the barrier layer, a cap layer on the barrier layer, and a source ohmic structure that is recessed into a source region of the barrier layer and spaced apart from the drain electrode.

In some embodiments, a dynamic source resistance that increases as a drain current increases is offset by controlling a current through the barrier layer. Some embodiments provide that the current through the barrier layer is controlled based on a distance between the source ohmic structure and the two dimensional gas in the channel layer.

Some embodiments include a gate electrode on the barrier layer and spaced apart from the drain electrode and provide that a portion of the barrier layer that is between the gate electrode and the source region is electrically insulated from the gate electrode.

In some embodiments, source ohmic structure comprises n+ conductivity. Some embodiments provide that the barrier layer comprises an AlGaN material and the source ohmic structure includes silicon that is implanted into the barrier layer in the source region. Some embodiments include a graded region that is between a side surface of the source ohmic structure and the channel layer. In some embodiments, the graded region includes conductivity transition values between the n+ conductivity of the source ohmic structure to an n− conductivity of the channel layer. In some embodiments, the graded region is generated using an angular implantation during implantation of the source ohmic structure.

Some embodiments provide that the source ohmic structure is partially recessed into the barrier layer and is spaced apart from the channel layer.

Some embodiments provide that the source ohmic structure is recessed through the barrier layer and partially into the channel layer.

In some embodiments, the source ohmic structure contacts the interface between the channel layer and the barrier layer.

Some embodiments provide that an upper surface of the source ohmic structure is at substantially a same height as an upper surface of the barrier layer.

Some embodiments include a source electrode that is on the source ohmic structure.

In some embodiments, the barrier layer includes a recess that is through the barrier layer in the source region and the source ohmic structure comprises a material that includes metal and contacts the channel layer at the interface between the channel layer and the barrier layer. Some embodiments provide that the source ohmic structure is annealed before a source electrode is formed.

Some embodiments include a drain ohmic structure that is recessed into the drain region of the barrier layer, wherein the drain electrode is on the drain ohmic structure.

In some embodiments, a dynamic drain resistance that increases as a drain current increases is offset by controlling a current through the barrier layer. Some embodiments provide that the current through the barrier layer is controlled based on a distance between the drain ohmic structure and the two dimensional gas in the channel layer.

In some embodiments, the drain ohmic structure comprises n+ conductivity. Some embodiments provide that the barrier layer comprises an AlGaN material and the drain ohmic structure includes silicon that is implanted into the barrier layer in the drain region.

Some embodiments include a graded region that is between a side surface of the drain ohmic structure and the channel layer. In some embodiments, the graded region including conductivity transition values between the conductivity of the drain ohmic structure to a conductivity of the channel layer. In some embodiments, the graded region is generated using an angular implantation during implantation of the drain ohmic structure.

Some embodiments include a gate electrode on the barrier layer and spaced apart from the drain electrode. In some embodiments, a portion of the barrier layer that is between the gate electrode and the drain region is electrically insulated from the gate electrode.

In some embodiments, the drain ohmic structure is partially recessed into the barrier layer and is spaced apart from the channel layer. Some embodiments provide that the drain ohmic structure is recessed through the barrier layer and partially into the channel layer. In some embodiments, the drain ohmic structure contacts the interface between the channel layer and the barrier layer. Some embodiments provide that an upper surface of the drain ohmic structure is at substantially a same height as an upper surface of the barrier layer.

In some embodiments, the barrier layer includes a recess that is through the barrier layer in the drain region, and the drain ohmic structure includes a material that includes metal and contacts the channel layer at the interface between the channel layer and the barrier layer. In some embodiments, the drain ohmic structure is annealed before the drain electrode is formed.

Some embodiments of the present invention are directed to a transistor device that includes a substrate, a channel layer on the substrate, the channel layer including a GaN material, a barrier layer that is on the channel layer and that includes an AlGaN material, a drain electrode that is on the barrier layer in a drain region of the device, a source ohmic structure that is at least partially recessed into the barrier layer in a source region of the device, a source electrode that is on the source ohmic structure, and a gate contact that is on the barrier layer and that is in a gate region of the device that is between the drain region and the source region.

In some embodiments, the barrier layer and the channel layer induce a two dimensional electron gas in the channel layer at an interface between the channel layer and the barrier layer and a dynamic source resistance that increases as a drain current increases is offset by controlling a current through the barrier layer.

Some embodiments provide that the current through the barrier layer is controlled based on a distance between the source ohmic structure and the two dimensional-gas in the channel layer.

In some embodiments, the source ohmic structure includes silicon that is implanted into the barrier layer in the source region.

Some embodiments provide that the source ohmic structure is partially recessed into the barrier layer and is spaced apart from the channel layer. In some embodiments, the source ohmic structure extends through the barrier layer and is partially recessed into the channel layer.

Some embodiments provide that the barrier layer includes a recess that is through the barrier layer in the source region and the source electrode comprises a material that includes metal and contacts the channel layer at the interface between the channel layer and the barrier layer.

It is noted that aspects of the invention described with respect to one embodiment, may be incorporated in a different embodiment although not specifically described relative thereto. That is, all embodiments and/or features of any embodiment can be combined in any way and/or combination. These and other objects and/or aspects of the present invention are explained in detail in the specification set forth below.

BRIEF DESCRIPTION OF THE DRAWINGS

The accompanying drawings, which are included to provide a further understanding and are incorporated in and constitute a part of this application, illustrate certain embodiment(s) described herein. In the drawings.

DETAILED DESCRIPTION

As provided above, current dependent source resistance of GaN HEMTs that depends on current may introduce non-linearity that adversely affects device performance. Although conventional approaches may suggest that reducing the source resistance to zero or near zero may be desirable, this approach is limited by the physics of the devices. As such, instead of reducing the source resistance, embodiments herein may be directed to providing device structures that may operate in a complementary manner relative to the conventional source resistance and thus offset the conventional source resistance. In this manner, the non-linearity of the source resistance may be reduced or substantially eliminated.

Figure 1:
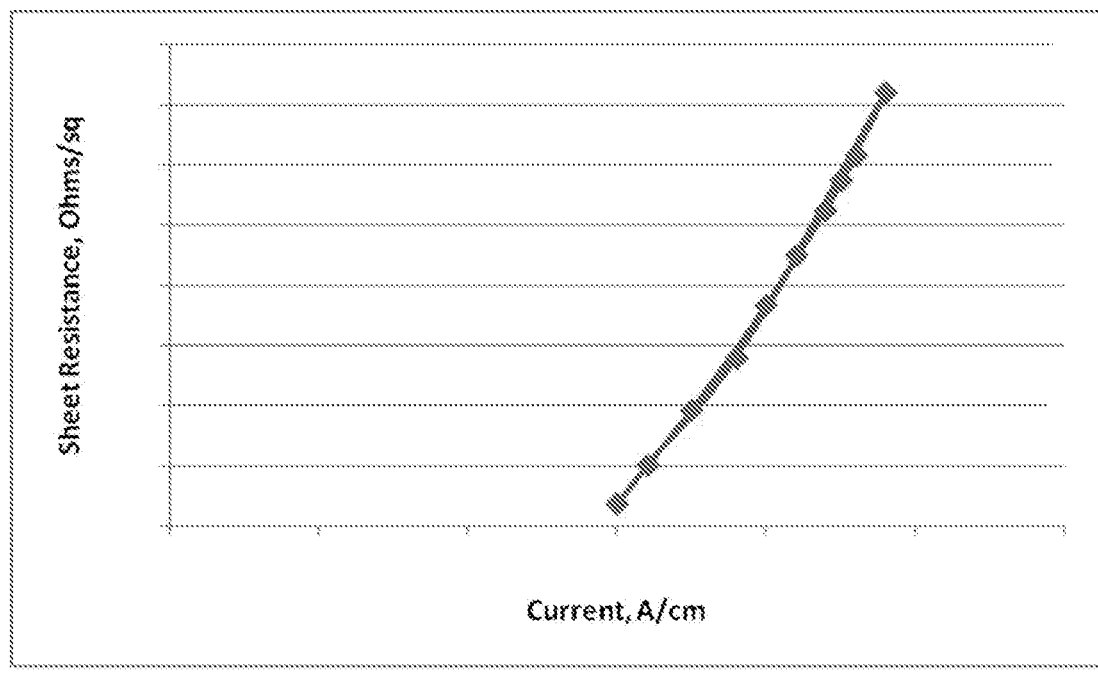
FIG. 1 is a graph including a plot that illustrates GaN source resistance as a function of current in a conventional transistor.
Figure 2:
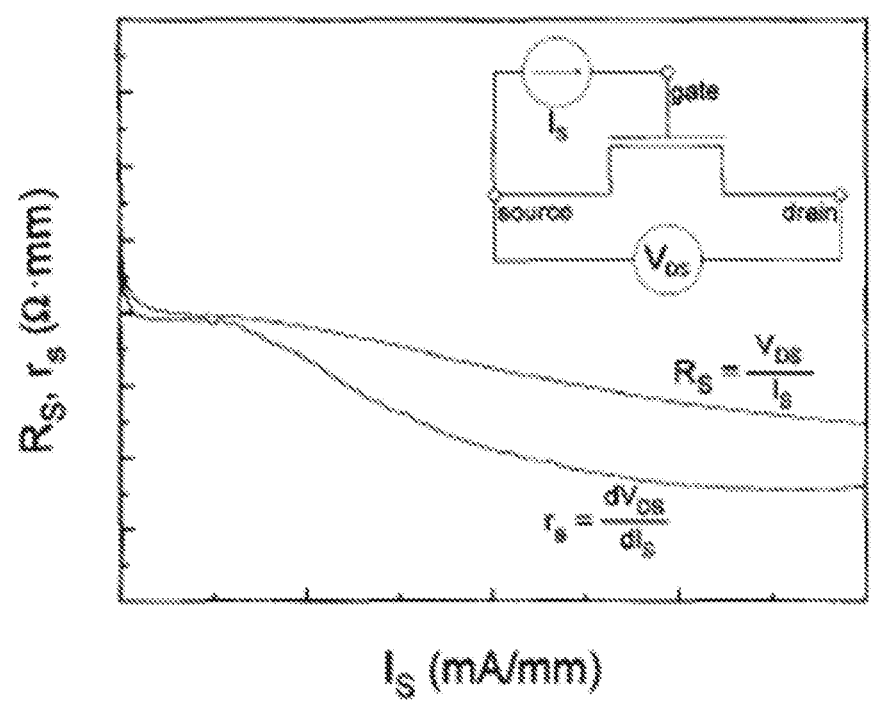
FIG. 2 is a graph that includes plots of static and dynamic source resistance as a function of source current in an InAlAs HEMT device.

Brief reference is made to FIG. 2, which is a graph that includes plots of static and dynamic source resistance as a function of source current in an InAlAs HEMT device. HEMT devices may be characterized by the formation of a two-dimensional electron gas (2DEG) channel. As illustrated, the static source resistance $R_S$ is based on the ratio between the drain-to-source voltage $V_{DS}$ and the source current $I_S$ and is generally linear. Additionally, the dynamic source resistance $r_s$ is based on the ratio of the change of the drain-to-source voltage $dV_{DS}$ relative to the change in the source current $dI_S$. Both the static source resistance and the dynamic source resistance decrease as drain current increases as a result of the nature of the current flow from the 2D electron gas to the cap layer through the barrier layer. At high currents, the barrier layer becomes forward biased thus reducing its resistance and thereby the contact resistance. As disclosed herein, some embodiments of the present invention provide similar approaches to offsetting the source resistance increases present in GaN HEMTs to improve linearity.

Figure 3:
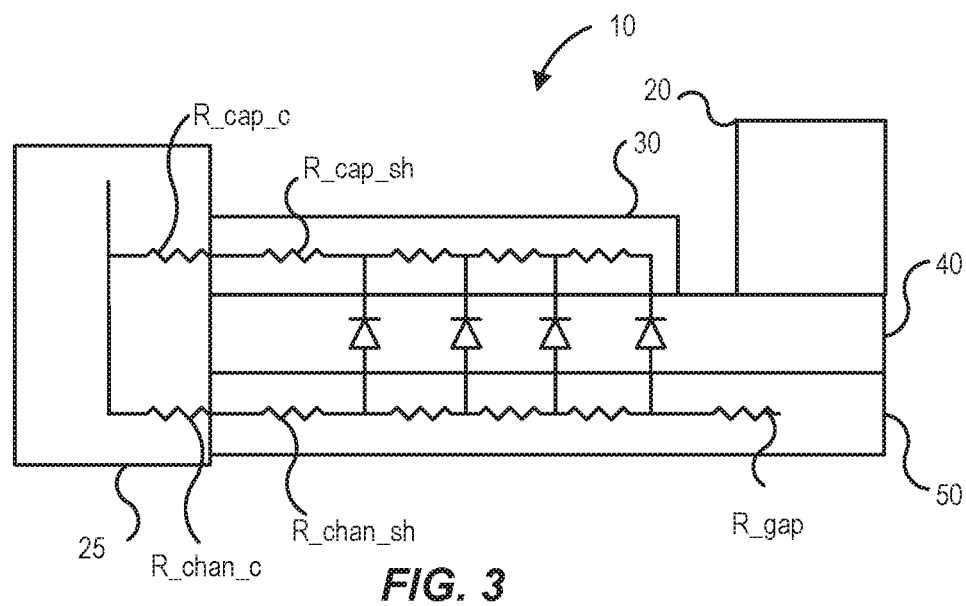
FIG. 3 is a schematic cross-section of a source region of a transistor illustrating current transfer between a cap layer and a channel layer in some embodiments of the present invention.

Reference is now made to FIG. 3, which is a schematic cross-section of a source region of an InAlAs based HEMT device illustrating current transfer between a cap layer and a channel layer in some embodiments of the present invention. The InAlAs based HEMT device 10 includes a semiconductor structure including a substrate (not shown here), a channel layer 50, a barrier layer 40, a cap layer 30, a gate electrode 20 and a source electrode 25. Some embodiments provide that the channel layer 50 may be formed on the substrate and the barrier layer 40 may be formed on the channel layer 50.

The gate electrode 20 may be formed on a gate region of the barrier layer 40 and the source electrode 25 may be formed in a source region of the InAlAs based HEMT device 10 and may contact one or more surfaces of the cap layer 30, the barrier layer 40, and the channel layer 50. The cap layer 30 may be formed on a portion of the barrier layer 40 and may be insulated from the gate electrode 20. In some embodiments, the cap layer 30 and the gate electrode 20 may be separated by an air gap or other insulating and/or dielectric material.

In operation, as the source current increases, the barrier layer 40 becomes forward biased and begins to conduct current from the channel layer 50, which may have an n+ conductivity to the cap layer 30, which may also have an n+ conductivity. In some embodiments, an n+ conductivity may refer to the conductivity of an n-type material with a high doping concentration and an n- conductivity may refer to a material with a lower level of doping. Thus, as shown in the schematic equivalent, by virtue of the diode-like performance of the barrier layer as current increases, the source resistance decreases. As disclosed herein, some embodiments herein are directed to structures that provide a similar result to provide a compensating source resistance that may off-set source resistance in a GaN HEMT.

Figure 4:
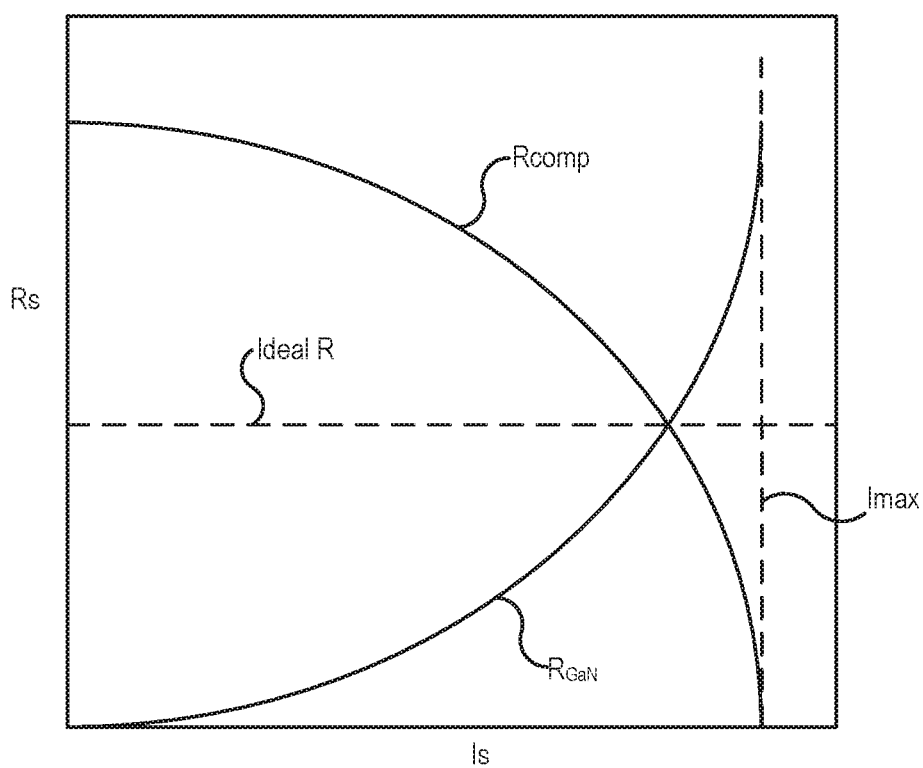
FIG. 4 is a graph including schematic plots of source resistance, compensation source resistance and ideal source resistance in accordance with some embodiments of the present invention.

Brief reference is now made to FIG. 4, which is a graph including schematic plots of estimated GaN source resistance and compensation source resistance in accordance with some embodiments of the present invention. Each of the plots represents the dynamic source resistance Rs as a function of source current Is. As illustrated, the estimated GaN source resistance $R_{GaN}$ increases in a nonlinear fashion across the source current Is range from zero to a maximum operating value Imax. According to some embodiments herein, a compensating source resistance Rcomp may be provided such that the sum of the GaN source resistance $R_{GaN}$ and the compensating source resistance Rcomp may result in a generally linear source resistance Ideal R. In this manner, the nonlinear nature of the source resistance may be reduced or eliminated. GaN HEMT structures that may provide the compensating source resistance Rcomp are provided herein.

Figure 5:
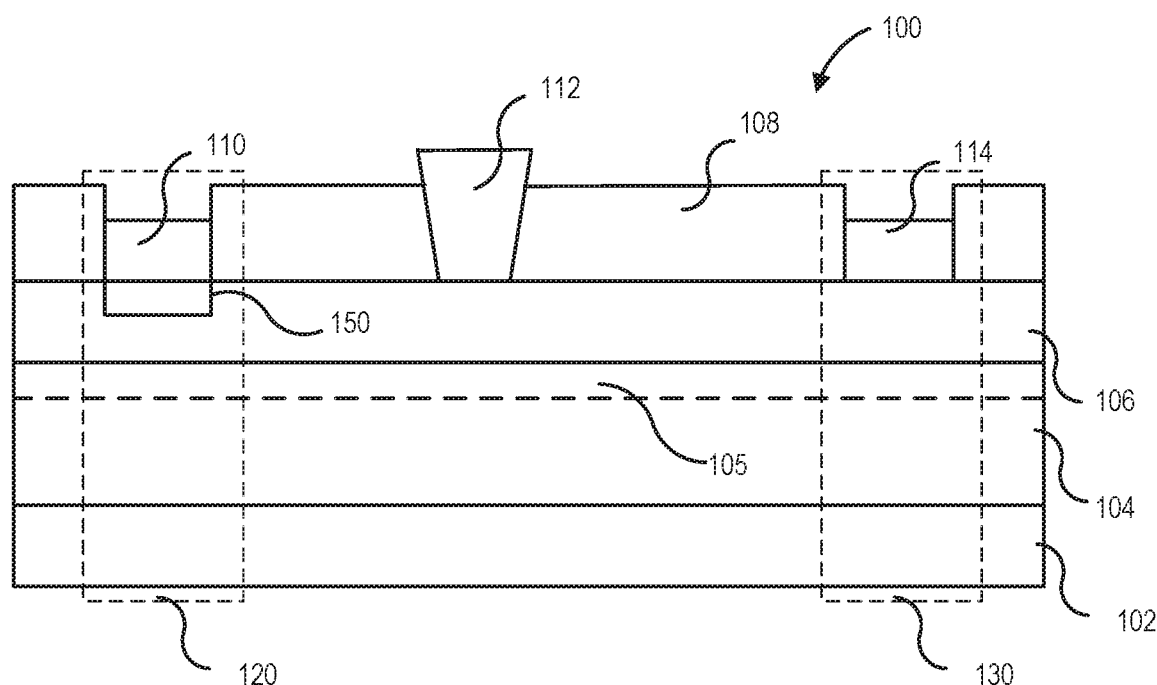
FIG. 5 is a schematic block diagram illustrating a cross section of a HEMT device including current dependent compensating source resistance in accordance with some embodiments of the present invention.

For example, reference is now made to FIG. 5, which is a schematic block diagram illustrating a cross section of a HEMT device including current dependent compensating source resistance in accordance with some embodiments of the present invention. In some embodiments, the HEMT device 100 includes a substrate 102, which may, for example, include 4H—SiC or 6H—SiC. A channel layer 104 is formed on the substrate 102, and a barrier layer 106 is formed on the channel layer 104. The channel layer 104 and the barrier layer 106 may include Group III-nitride based materials, with the material of the barrier layer 106 having a higher bandgap than the material of the channel layer 104.

For example, the channel layer 104 may comprise GaN, while the barrier layer 106 may comprise AlGaN and/or AlN.

Due to the difference in bandgap between the barrier layer 106 and the channel layer 104 and piezoelectric effects at the interface between the barrier layer 106 and the channel layer 104, a two dimensional electron gas (2DEG) 105 is induced in the channel layer 104 at a junction between the channel layer 104 and the barrier layer 106. The 2DEG 105 is a highly conductive layer that allows conduction between a source region 120 and a drain region 130 of the device beneath the source electrode 110 and the drain electrode 114, respectively. As illustrated in FIG. 5, the source region 120 refers to a portion of the HEMT device that generally corresponds to the source electrode 110 and may include multiple ones of the layers therein. Similarly, the drain region 130 refers to a portion of the HEMT 100 that generally corresponds to the drain electrode 114 and may include multiple ones of the layers therein. A drain electrode 114 may be formed on the barrier layer 106 in the drain region 130.

Figure 20:
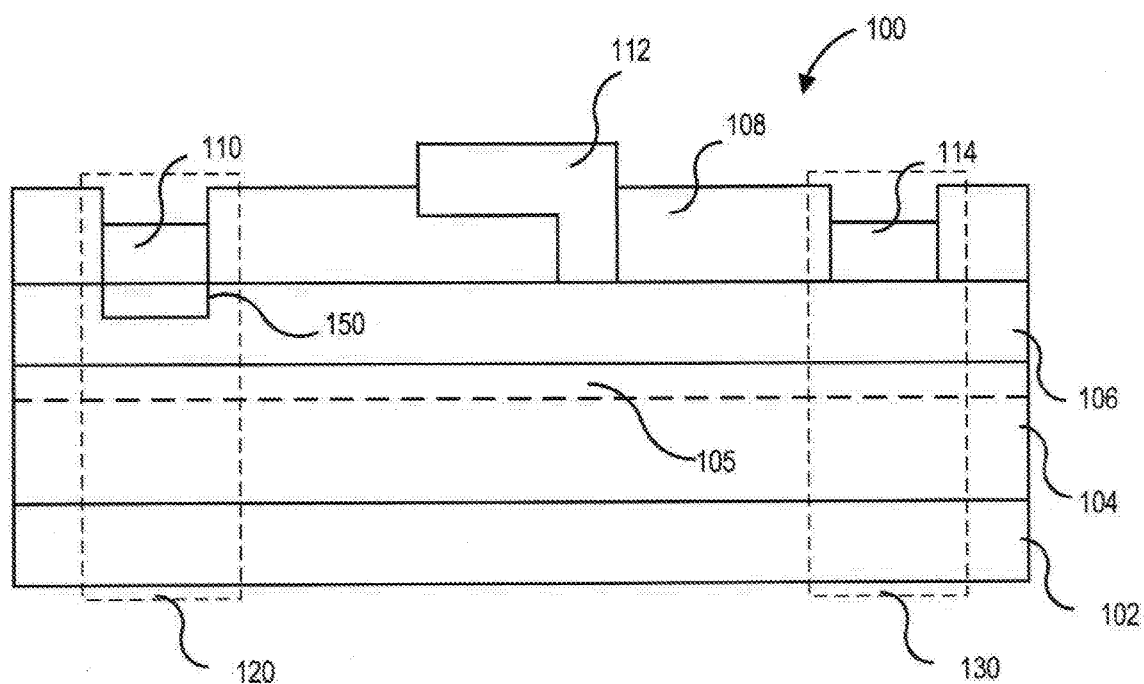
FIG. 20 is a schematic block diagram illustrating a cross section of a HEMT device including current dependent compensating source resistance in accordance with some embodiments of the present invention.

A cap layer 108 is formed on the substrate 102 on portions of the barrier layer 106. Some embodiments provide that the cap layer 108 includes recesses in which the source electrode 110, the drain electrode 114 and a gate electrode 112 may be formed. Although illustrated as a generally planar element, the gate electrode 112 may include other shapes, and/or geometries, including for example, a T-shaped or L-shaped geometry such that portions of the gate electrode 112 may extend in different directions that may be orthogonal to one another. For example, brief reference is made to FIG. 20, which is a schematic block diagram illustrating a cross section of a HEMT device including current dependent compensating source resistance in accordance with some embodiments of the present invention. As illustrated, the gate electrode 112 may extend in a first direction that is substantially parallel to surfaces of the layers (e.g., 102, 104, 106) and a second direction that is non-parallel to surfaces of the layers (e.g., 102, 104, 106). For example, the second direction may be substantially orthogonal to the first direction to include a shape such as an L-shape or a T-shape, among others. The cap layer 108 may include a dielectric material, such as SiN, $SiO_2$, $Al_2O_3$, and/or other high dielectric materials, among others.

Embodiments may include a source ohmic structure 150 that is recessed into the barrier layer 106. The distance between the source ohmic structure 150 and the 2DEG 105 may control the current flow through the barrier layer 106. For example, lower values of source resistance at any given current may be provided by reducing the distance between the source ohmic structure 150 and the 2DEG 105. Stated differently, the current flowing through the barrier layer 106 may provide a compensating source resistance as the barrier layer 106 becomes increasingly forward biased.

In some embodiments, the source ohmic structure 150 includes silicon and/or germanium, among others, that may be implanted into the barrier layer 106 in the source region 120 before the source electrode 110 is formed. Some embodiments provide that the source ohmic structure 150 may have an n+ conductivity and the channel layer 104 may have an n− conductivity. Some embodiments provide that the source ohmic structure 150 is configured to be below the source electrode 110 without extending laterally beyond the side surfaces of the source electrode 110. Some embodiments provide that the source ohmic structure 150 may extend laterally beyond side surfaces of the source electrode 110. In some embodiments, the source electrode 110 may be formed to extend partially through the barrier layer 106 without extending completely through the barrier layer 106. For example, a portion of the barrier layer 106 may be between the source ohmic structure 150 and the channel layer 104. Embodiments herein may include only the source ohmic structure 150 without a corresponding structure in the drain region. Embodiments herein may include devices including a drain ohmic structure without a corresponding source structure. Embodiments disclosed herein may include both source and drain electrodes 110, 114.

As discussed herein, a source ohmic structure 150 and/or a drain ohmic structure may be generated through implantation processes. For example, some embodiments provide that the source ohmic structure 150 and/or a drain ohmic structure include(s) implants that may include silicon and/or germanium, among others. In some embodiments, the source ohmic structure 150 and/or the drain ohmic structure may be formed by etching into one or more of the device layers, such as the cap layer, the barrier layer 106, and/or the channel layer 104 and depositing a metallic material. Some embodiments provide one or the other of the source ohmic structure 150 or the drain ohmic structure corresponds to an implantation process and the other one of the source ohmic structure 150 and the drain ohmic structure corresponds to a metallic material that is deposited after an etching operation.

Figure 6:
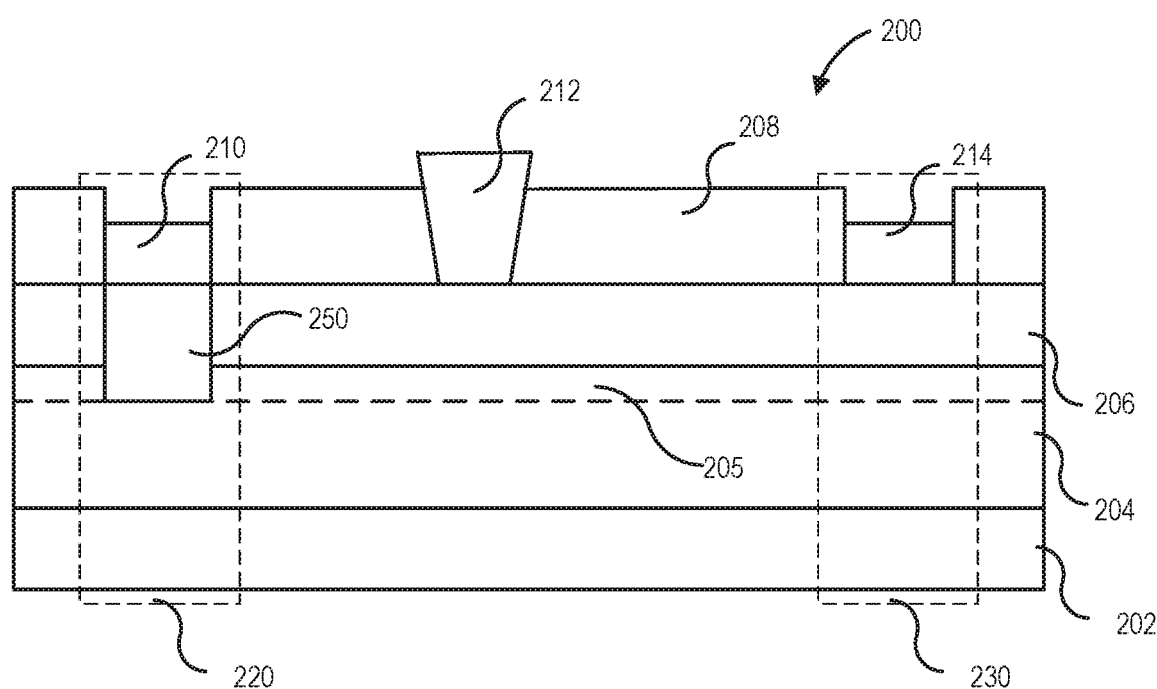
FIG. 6 is a schematic block diagram illustrating a cross section of a HEMT device including current dependent compensating source resistance in accordance with some other embodiments of the present invention.

Reference is now made to FIG. 6, which is a schematic block diagram illustrating a cross section of a HEMT device including current dependent compensating source resistance in accordance with some other embodiments of the present invention. In some embodiments, the HEMT device 200 includes a substrate 202, which may, for example, include 4H—SiC or 6H—SiC. A channel layer 204 is formed on the substrate 202, and a barrier layer 206 is formed on the channel layer 204. The channel layer 204 and the barrier layer 206 may include Group III-nitride based materials, with the material of the barrier layer 206 having a higher bandgap than the material of the channel layer 204. For example, the channel layer 204 may comprise GaN, while the barrier layer 206 may comprise AlGaN and/or AlN.

Due to the difference in bandgap between the barrier layer 206 and the channel layer 204 and piezoelectric effects at the interface between the barrier layer 206 and the channel layer 204, a two dimensional electron gas (2DEG) 205 is induced in the channel layer 204 at a junction between the channel layer 204 and the barrier layer 206. The 2DEG 205 is a highly conductive layer that allows conduction between a source region 220 and a drain region 230 of the device beneath the source electrode 210 and the drain electrode 214, respectively. A drain electrode 214 may be formed on the barrier layer 206 in the drain region 130.

A cap layer 208 is formed on the substrate 202 on portions of the barrier layer 206. Some embodiments provide that the cap layer 208 includes recesses in which the source electrode 210, the drain electrode 214 and a gate electrode 212 may be formed. The cap layer 208 may include a dielectric material, such as SiN, $SiO_2$, etc.

Embodiments may include a source ohmic structure 250 that is recessed into and that extends through the barrier layer 206. The source ohmic structure 250 may be partially recessed into and extend into the 2DEG 205. Some embodiments provide that the source ohmic structure 250 may extend into any depth into the channel layer 204. The current flow through the barrier layer 206 may be controlled by the amount by which the source ohmic structure 250 extends into the 2DEG 205. In some embodiments, there is a space between the source ohmic structure 250 and the 2DEG 205. For example, lower values of source resistance at any given current may be provided by increasing the amount by which the source ohmic structure 150 contacts the 2DEG 205. The source electrode 210 may be formed on a top surface of the source ohmic structure 250. Some embodiments provide that the current flowing through the barrier layer 206 and may provide a compensating source resistance as the barrier layer 206 becomes increasingly forward biased. Some embodiments provide that the source ohmic structure 250 may extend laterally beyond side surfaces of the source electrode 210. In some embodiments, the source electrode 210 may be formed to extend partially through the barrier layer 206 without extending completely through the barrier layer 206. Embodiments disclosed herein may include both source and drain electrodes.

In some embodiments, the source ohmic structure 250 includes silicon that is implanted into the barrier layer 206 in the source region 220 before the source electrode 210 is formed. Some embodiments provide that the source ohmic structure 250 may have an n+ conductivity and the channel layer 204 may have an n− conductivity. Embodiments herein may include only the source ohmic structure without a corresponding structure in the drain region. Embodiments herein may also include devices including a drain ohmic structure without a corresponding source structure.

Figure 7:
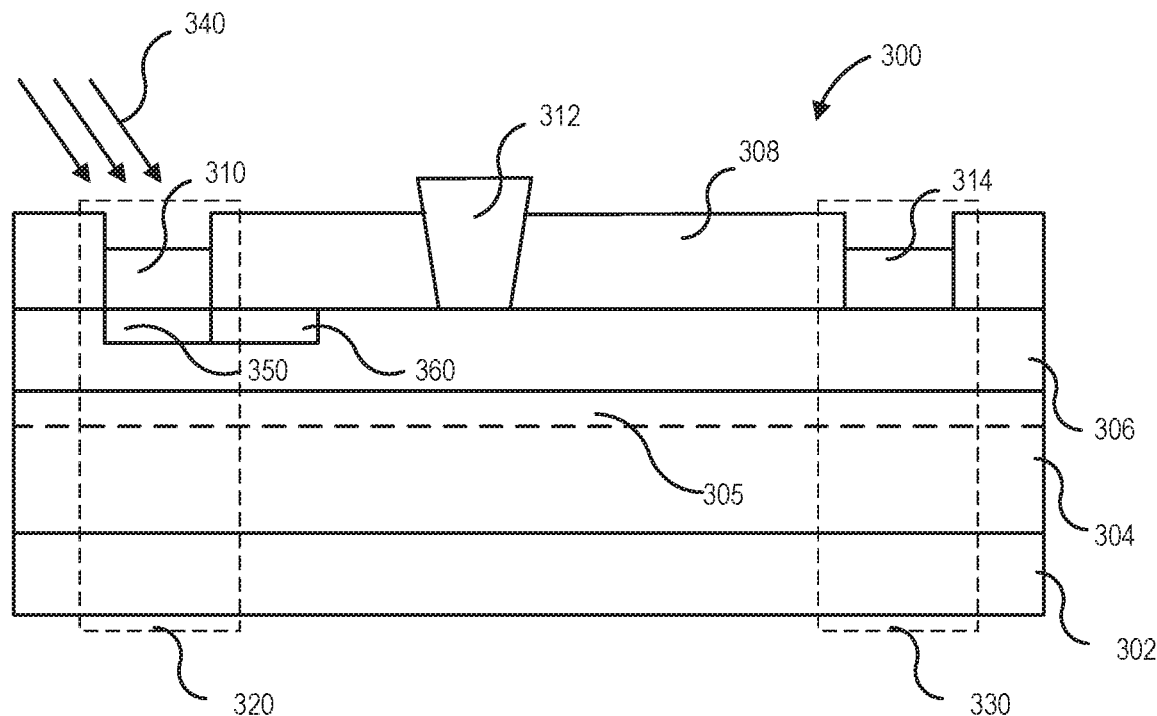
FIG. 7 is a schematic block diagram illustrating a cross section of a HEMT device including current dependent compensating source resistance in accordance with some other embodiments of the present invention.

Reference is now made to FIG. 7, which is a schematic block diagram illustrating a cross section of a HEMT device including current dependent compensating source resistance in accordance with some other embodiments of the present invention. In some embodiments, the HEMT device 300 includes a substrate 302, which may, for example, include 4H—SiC or 6H—SiC. A channel layer 304 is formed on the substrate 302, and a barrier layer 306 is formed on the channel layer 304. The channel layer 304 and the barrier layer 306 may include Group III-nitride based materials, with the material of the barrier layer 306 having a higher bandgap than the material of the channel layer 304. For example, the channel layer 304 may comprise GaN, while the barrier layer 306 may comprise AlGaN.

Due to the difference in bandgap between the barrier layer 306 and the channel layer 304 and piezoelectric effects at the interface between the barrier layer 306 and the channel layer 304, a two dimensional electron gas (2DEG) 305 is induced in the channel layer 304 at a junction between the channel layer 304 and the barrier layer 306. The 2DEG 305 is a highly conductive layer that allows conduction between a source region 320 and a drain region 330 of the device beneath the source electrode 310 and the drain electrode 314, respectively. A drain electrode 314 may be formed on the barrier layer 306 in the drain region 330.

A cap layer 308 is formed on the substrate 302 on portions of the barrier layer 306. Some embodiments provide that the cap layer 308 includes recesses in which the source electrode 310, the drain electrode 314 and a gate electrode 312 may be formed. The cap layer 308 may include a dielectric material, such as SiN, $SiO_2$, etc.

Embodiments may include a source ohmic structure 350 that is recessed into the barrier layer 306 without extending completely through the barrier layer 306. The distance between the source ohmic structure 350 and the 2DEG 305 may control the current flow through the barrier layer 306. For example, lower values of source resistance at any given current may be provided by reducing the distance between the source ohmic structure 350 and the channel layer 304. Stated differently, the current flowing through the barrier layer 306 may provide a compensating source resistance as the barrier layer 306 becomes increasingly forward biased.

Some embodiments further include a graded region 360 that includes portions having different conductivity transition values from the source ohmic structure 350 to the barrier layer 306. In some embodiments, the source ohmic structure 350 may be graded or partially graded. As used herein, the term "graded region" may include a region that includes a first portion having a first conductivity, a second portion having a second conductivity that is different from the first conductivity, and a transitional portion having a gradually changing conductivity therein that is between the first portion and the second portion and that transitions from the first conductivity to the second conductivity. In some embodiments, the source ohmic structure 350 includes silicon that is implanted into the barrier layer 306 in the source region 320 before the source electrode 310 is formed. Some embodiments provide that the source ohmic structure 350 may have an n+ conductivity and the channel layer 304 may have an n− conductivity. In some embodiments, the graded region 360 may be formed by performing an angularly directed implantation 340. In this manner, the portion of the graded region 360 that is near the source ohmic structure 350 includes a conductivity that is the same or very close to that of the source ohmic structure 350. Similarly, a portion of the graded region 360 that is furthest from the source ohmic structure 350 includes a conductivity that is the same or very close to that of the barrier layer 306. Embodiments herein may include only the source ohmic structure without a corresponding structure in the drain region. Embodiments herein may also include devices including a drain ohmic structure without a corresponding source structure.

Figure 8:
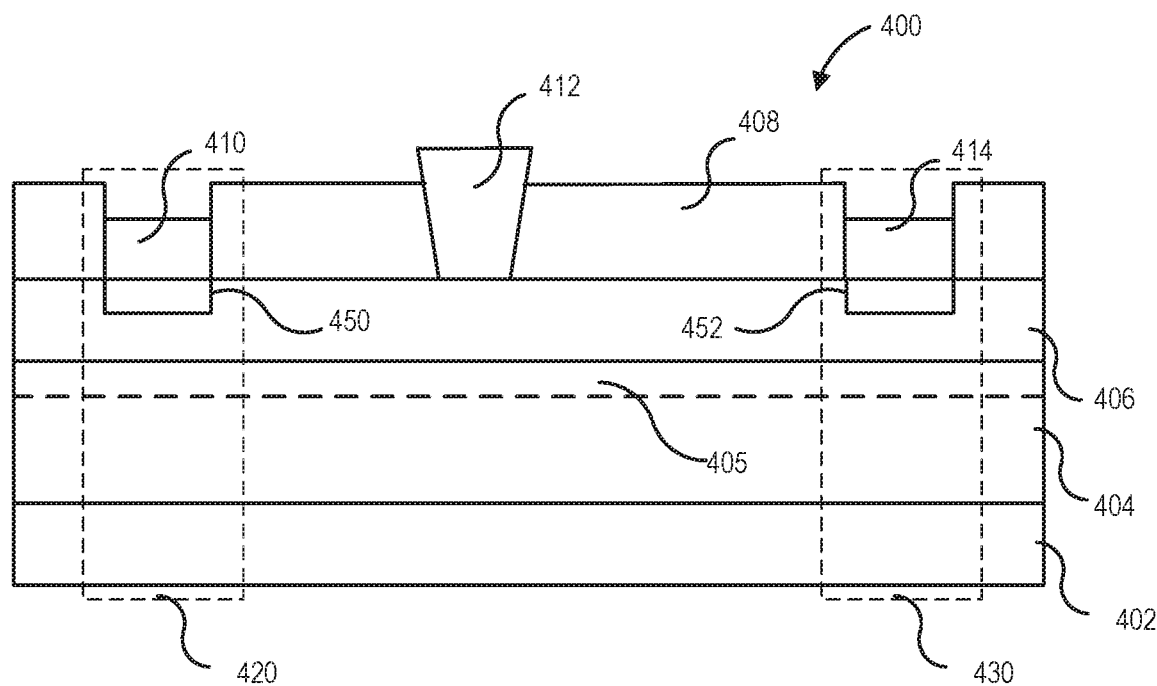
FIG. 8 is a schematic block diagram illustrating a cross section of a HEMT device including current dependent compensating source and drain resistance in accordance with some embodiments of the present invention.

For example, reference is now made to FIG. 8, which is a schematic block diagram illustrating a cross section of a HEMT device including current dependent compensating source and drain resistance in accordance with some embodiments of the present invention. In some embodiments, the HEMT device 400 includes a substrate 402, which may, for example, include 4H—SiC or 6H—SiC. A channel layer 404 is formed on the substrate 402, and a barrier layer 106 is formed on the channel layer 404. The channel layer 404 and the barrier layer 406 may include Group III-nitride based materials, with the material of the barrier layer 406 having a higher bandgap than the material of the channel layer 404. For example, the channel layer 104 may comprise GaN, while the barrier layer 406 may comprise AlGaN and/or AlN.

Due to the difference in bandgap between the barrier layer 406 and the channel layer 404 and piezoelectric effects at the interface between the barrier layer 406 and the channel layer 404, a two dimensional electron gas (2DEG) 405 is induced in the channel layer 404 at a junction between the channel layer 404 and the barrier layer 406. The 2DEG 405 is a highly conductive layer that allows conduction between a source region 420 and a drain region 430 of the device beneath the source electrode 410 and the drain electrode 414, respectively. A drain electrode 114 may be formed on the barrier layer 106 in the drain region 430.

A cap layer 408 is formed on the substrate 402 on portions of the barrier layer 406. Some embodiments provide that the cap layer 408 includes recesses in which the source electrode 410, the drain electrode 414 and a gate electrode 412 may be formed. The cap layer 408 may include a dielectric material, such as SiN, $SiO_2$, etc.

Embodiments may include a source ohmic structure 450 that is recessed into the barrier layer 406. The distance between the source ohmic structure 450 and the 2DEG 405 may control the current flow through the barrier layer 406. For example, lower values of source resistance at any given current may be provided by reducing the distance between the source ohmic structure 450 and the 2DEG 405. Stated differently, the current flowing through the barrier layer 406 may provide a compensating source resistance as the barrier layer 106 becomes increasingly forward biased.

In some embodiments, the source ohmic structure 450 includes silicon that is implanted into the barrier layer 406 in the source region 420 before the source electrode 410 is formed. Some embodiments provide that the source ohmic structure 450 may have an n+ conductivity and the channel layer 404 may have an n− conductivity. Some embodiments provide that the source ohmic structure 450 is configured to be below the source electrode 410 without extending laterally beyond the side surfaces of the source electrode 410.

Embodiments may include a drain ohmic structure 452 that is recessed into the barrier layer 406. The distance between the drain ohmic structure 452 and the 2DEG 405 may control the current flow through the barrier layer 406. For example, lower values of drain resistance at any given current may be provided by reducing the distance between the drain ohmic structure 452 and the 2DEG 405. Stated differently, the current flowing through the barrier layer 406 may provide a compensating source resistance as the barrier layer 106 becomes increasingly forward biased.

In some embodiments, the drain ohmic structure 452 includes silicon that is implanted into the barrier layer 406 in the drain region 430 before the drain electrode 414 is formed. Some embodiments provide that the drain ohmic structure 452 may have an n+ conductivity and the channel layer 404 may have an n− conductivity. Some embodiments provide that the drain ohmic structure 452 is configured to be below the drain electrode 414 without extending laterally beyond the side surfaces of the drain electrode 414.

As illustrated in FIG. 8, a HEMT device 400 may provide that the source and drain regions 420, 430 may include similar structures relative to one another. For example, some embodiments provide that a source ohmic structure 450 and a drain ohmic structure 452 are provided in the HEMT device 400. As discussed above regarding FIG. 5, the HEMT device 100 may include only the source ohmic structure 150 without a corresponding structure in the drain region. Although not illustrated, embodiments herein may also include devices including a drain ohmic structure 452 without a corresponding source structure.

Figure 9:
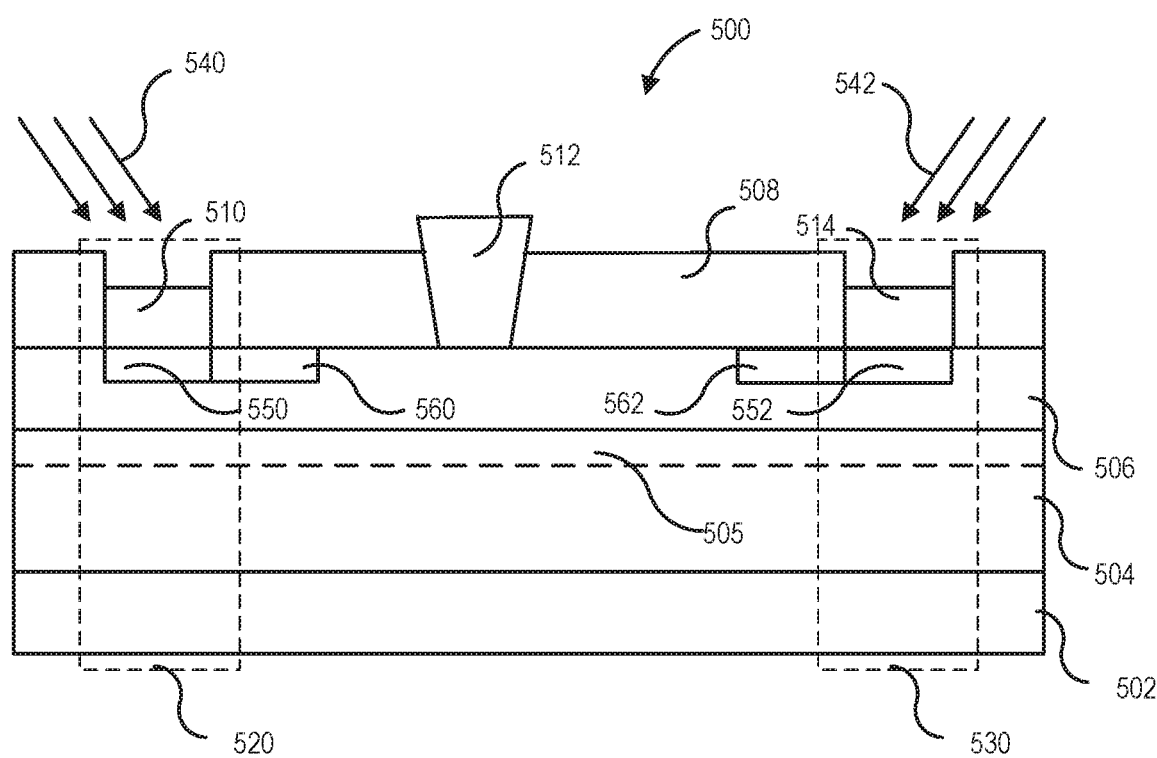
FIG. 9 is a schematic block diagram illustrating a cross section of a HEMT device including current dependent compensating source and drain resistance in accordance with some other embodiments of the present invention.

Reference is now made to FIG. 9, which is a schematic block diagram illustrating a cross section of a HEMT device including current dependent compensating source and drain resistance in accordance with some other embodiments of the present invention. In some embodiments, the HEMT device 500 includes a substrate 502, which may, for example, include 4H—SiC or 6H—SiC. A channel layer 504 is formed on the substrate 502, and a barrier layer 506 is formed on the channel layer 504. The channel layer 504 and the barrier layer 506 may include Group III-nitride based materials, with the material of the barrier layer 506 having a higher bandgap than the material of the channel layer 504. For example, the channel layer 504 may comprise GaN, while the barrier layer 506 may comprise AlGaN.

Due to the difference in bandgap between the barrier layer 506 and the channel layer 504 and piezoelectric effects at the interface between the barrier layer 506 and the channel layer 504, a two dimensional electron gas (2DEG) 505 is induced in the channel layer 504 at a junction between the channel layer 504 and the barrier layer 506. The 2DEG 505 is a highly conductive layer that allows conduction between a source region 520 and a drain region 530 of the device beneath the source electrode 510 and the drain electrode 514, respectively. A drain electrode 514 may be formed on the barrier layer 506 in the drain region 530.

A cap layer 508 is formed on the substrate 502 on portions of the barrier layer 506. Some embodiments provide that the cap layer 508 includes recesses in which the source electrode 510, the drain electrode 514 and a gate electrode 512 may be formed. The cap layer 508 may include a dielectric material, such as SiN, SiO$_2$, etc.

Embodiments may include a source ohmic structure 550 that is recessed into the barrier layer 506 without extending completely through the barrier layer 506. The distance between the source ohmic structure 550 and the 2DEG 505 may control the current flow through the barrier layer 506. For example, lower values of source resistance at any given current may be provided by reducing the distance between the source ohmic structure 550 and the 2DEG 505. Stated differently, the current flowing through the barrier layer 506 may provide a compensating source resistance as the barrier layer 506 becomes increasingly forward biased.

Some embodiments further include a graded region 560 that includes portions having different conductivity transition values from the source ohmic structure 550 to the barrier layer 506. In some embodiments, the source ohmic structure 550 includes silicon that is implanted into the barrier layer 506 in the source region 520 before the source electrode 510 is formed. Some embodiments provide that the source ohmic structure 550 may have an n+ conductivity and the channel layer 504 may have an n− conductivity. In some embodiments, the graded region 560 may be formed by performing an angularly directed implantation 540. In this manner, the portion of the graded region 560 that is near the source ohmic structure 550 includes a conductivity that is the same or very close to that of the source ohmic structure 550. Similarly, a portion of the graded region 560 that is furthest from the source ohmic structure 550 includes a conductivity that is the same or very close to that of the barrier layer 506.

Embodiments may include a drain ohmic structure 552 that is recessed into the barrier layer 506 without extending completely through the barrier layer 506. The distance between the drain ohmic structure 552 and the 2DEG 505 may control the current flow through the barrier layer 506. For example, lower values of drain resistance at any given current may be provided by reducing the distance between the drain ohmic structure 550 and the 2DEG 505. Stated differently, the current flowing through the barrier layer 506 may provide a compensating source resistance as the barrier layer 506 becomes increasingly forward biased.

Some embodiments further include a graded region 562 that includes portions having different conductivity transition values from the drain ohmic structure 552 to the barrier layer 506. In some embodiments, the drain ohmic structure 552 includes silicon that is implanted into the barrier layer 506 in the drain region 520 before the source electrode 510 is formed. Some embodiments provide that the drain ohmic structure 552 may have an n+ conductivity and the channel layer 504 may have an n− conductivity. In some embodiments, the graded region 562 may be formed by performing an angularly directed implantation 542. In this manner, the portion of the graded region 562 that is near the drain ohmic structure 552 includes a conductivity that is the same or very close to that of the drain ohmic structure 552. Similarly, a portion of the graded region 562 that is furthest from the drain ohmic structure 552 includes a conductivity that is the same or very close to that of the barrier layer 506.

Although illustrated as having both source ohmic structure 550 and drain ohmic structure 552, embodiments disclosed herein may include either source or drain ohmic structures 550, 552. Additionally, although not illustrated, embodiments herein may include any combination of different source and/or drain ohmic structures described herein in a single HEMT device.

Figure 10:
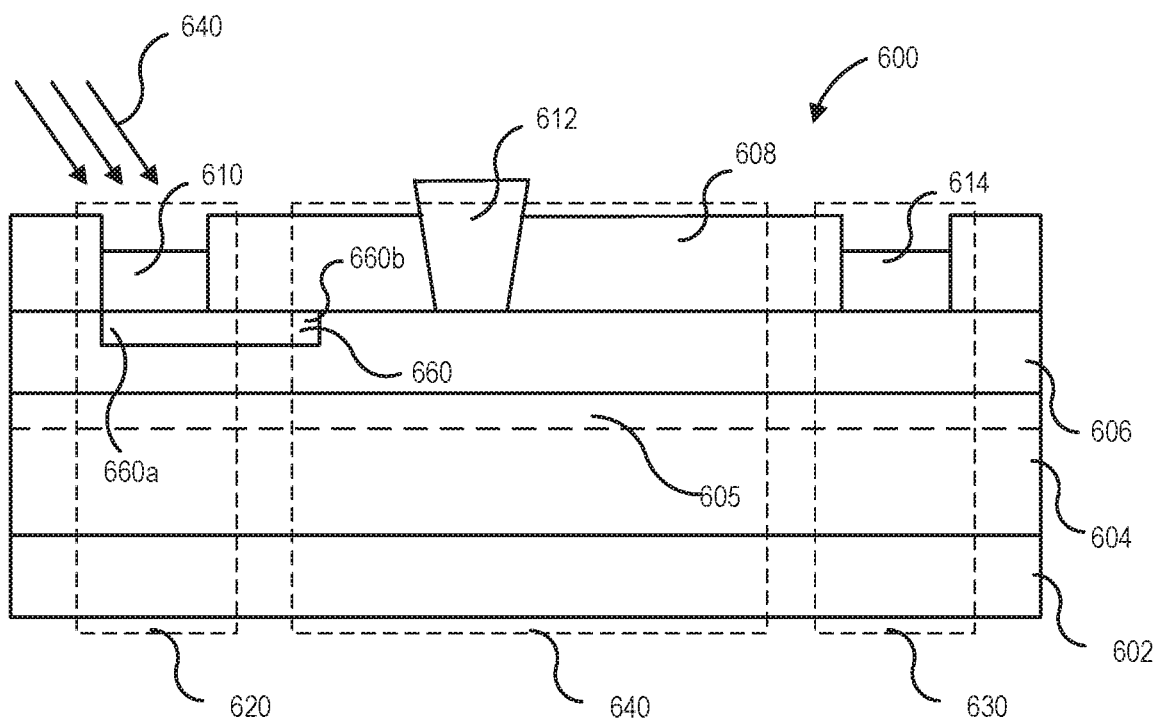
FIG. 10 is a schematic block diagram illustrating a cross section of a HEMT device including current dependent compensating source and drain resistance in accordance with some other embodiments of the present invention.

Reference is now made to FIG. 10, which is a schematic block diagram illustrating a cross section of a HEMT device including current dependent compensating source resistance in accordance with some other embodiments of the present invention. In some embodiments, the HEMT device 600 includes a substrate 602, which may, for example, include 4H—SiC or 6H—SiC. A channel layer 604 is formed on the substrate 602, and a barrier layer 606 is formed on the channel layer 604. The channel layer 604 and the barrier layer 606 may include Group III-nitride based materials, with the material of the barrier layer 606 having a higher bandgap than the material of the channel layer 604. For example, the channel layer 604 may comprise GaN, while the barrier layer 606 may comprise AlGaN, however, other materials may be used for the channel layer 604 and/or the barrier layer 606.

Due to the difference in bandgap between the barrier layer 606 and the channel layer 604 and piezoelectric effects at the interface between the barrier layer 606 and the channel layer 604, a two dimensional electron gas (2DEG) 605 is induced in the channel layer 604 at a junction between the channel layer 604 and the barrier layer 606. The 2DEG 605 is a highly conductive layer that allows conduction between a source region 620 and a drain region 630 of the device beneath the source electrode 610 and the drain electrode 614, respectively. A gate region 640 may be positioned between the source region 620 and the drain region 630. A drain electrode 614 may be formed on the barrier layer 606 in the drain region 630.

A cap layer 608 is formed on the substrate 602 on portions of the barrier layer 606. Some embodiments provide that the cap layer 608 includes recesses in which the source electrode 610, the drain electrode 614 and a gate electrode 612 may be formed. The cap layer 608 may include a dielectric material, such as SiN, $SiO_2$, etc.

Embodiments may include a source graded region 660 that is formed to be in the barrier layer 606 without extending completely through the barrier layer 606. The distance between the source graded region 660 and the 2DEG 605 may affect the current flow through the barrier layer 606. For example, lower values of source resistance at any given current may be provided by reducing the distance between the source graded region 660 and the channel layer 604. Stated differently, some embodiments provide that the current flowing through the barrier layer 606 between the graded region 660 and the 2DEG 605 may provide a compensating source resistance as the barrier layer 606 becomes increasingly forward biased. In some embodiments, the graded region 660 may be a laterally graded region having a dopant concentration that decreases laterally from the source region 610 to toward the gate contact 612. In some embodiments, the graded region 660 may be a laterally graded region having a dopant concentration that is low starting the 660a region, increases corresponding to a center portion of the graded region and then decreases in the 660b region towards the gate region. Some embodiments provide the dopant concentration ranges corresponding to graded regions disclosed herein may be in a range from about $10^{16}$ to about $10^{21}$ atoms per $cm^3$. In some embodiments, the dopant concentration ranges corresponding to graded regions herein may have a lower range limit of about $10^{14}$, $10^{15}$, $10^{16}$, $10^{17}$, or $10^{18}$ atoms per $cm^3$. In some embodiments, the dopant concentration ranges corresponding to graded regions herein may have an upper range limit of about $10^{19}$, $10^{20}$, $10^{21}$, $10^{22}$, or $10^{23}$ atoms per $cm^3$.

Some embodiments provide that the source graded region 660 includes portions having different conductivity transition values from the source region 620 to a portion of the source graded region 660 extending beyond the source region 620 in the barrier layer 606. In some embodiments, the source graded region 660 includes silicon dopant ions that are implanted into the barrier layer 606 in the source region 620. Some embodiments provide the silicon dopant ions may be implanted before the source electrode 610 is formed. Some embodiments provide that the source graded region 660 may include an n+ conductivity portion 660a in a portion of 660 that is below the source contact 610 in the source region 620 and may be graded to transition to an n− conductivity portion 660b in a portion of 660 closer to the gate contact 612. In some embodiments, the source graded region 660 may be formed by performing an angularly directed implantation 640. In this manner, the n+ conductivity portion 660a of the source graded region 660 may be formed in the source region 620 and the n− conductivity portion 660b of the source graded region 660 may extend into the barrier region 606 beyond the source region 620. As provided above, an additional source ohmic structure may also be formed in the source region 620 and may be formed to include similar depth dimensional characteristics as the source graded region 660.

Figure 11:
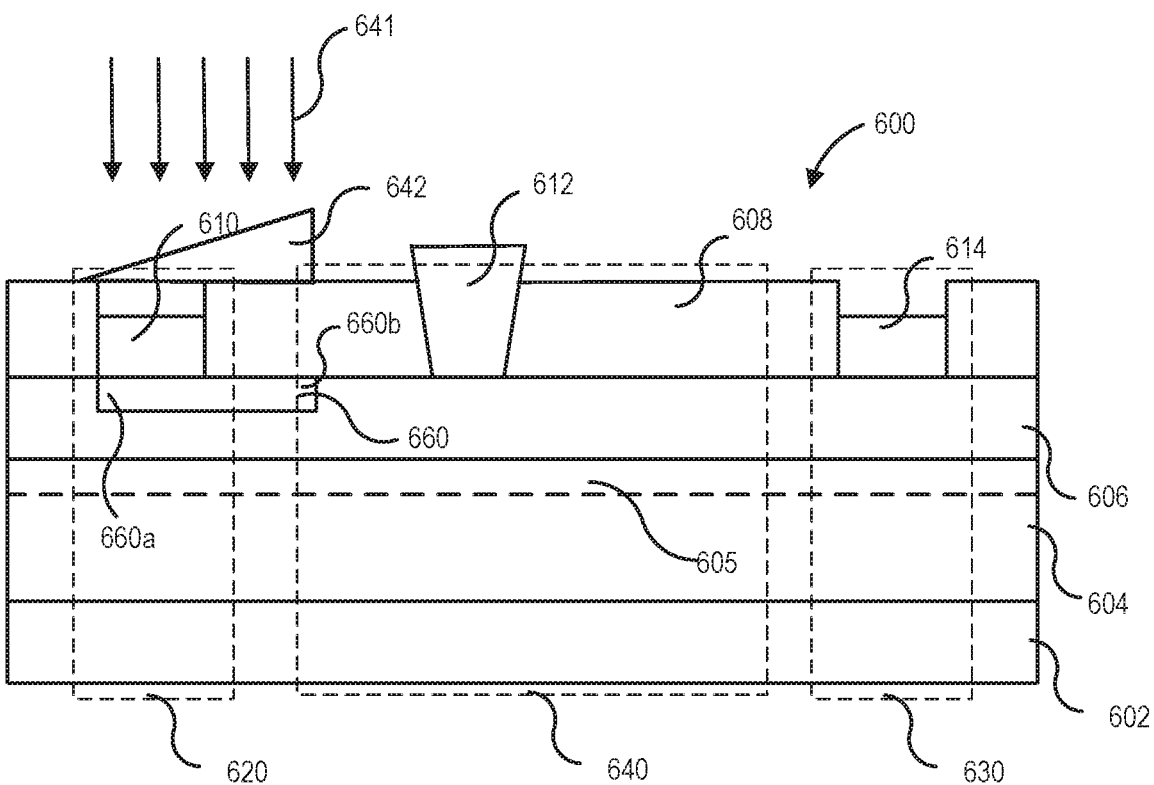
FIG. 11 is a schematic block diagram illustrating a cross section of a HEMT device including current dependent compensating source and drain resistance in accordance with some other embodiments of the present invention.

As discussed above regarding FIG. 10, the source graded region 660 may be formed by performing an angularly directed implantation 640. Brief reference is made to FIG. 11, which is a schematic block diagram illustrating a cross section of a HEMT device including current dependent compensating source resistance in accordance with some other embodiments of the present invention. FIG. 11 includes many elements discussed above in reference to FIG. 10 and thus will not be redundantly discussed. In some embodiments, the source graded region 660 may be formed using a straight (i.e., not angularly directed) implantation 641 that may be directed in a direction that is substantially orthogonal to the top surface of the substrate 602. Some embodiments provide the grading characteristic of the source graded region 660 may be achieved using a sloped implantation mask 642 region. The straight implantation 641 performed using the sloped implantation mask 642 may provide the grading of the source graded region from the n+ conductivity portion 660a to the n− conductivity portion 660b of the source graded region 660 that may extend into the barrier region 606 beyond the source region 620. Although illustrated on the cap layer 608, the sloped implantation mask 642 may be formed before the cap layer 608 is formed and removed after the implantation operation is performed.

Figure 12:
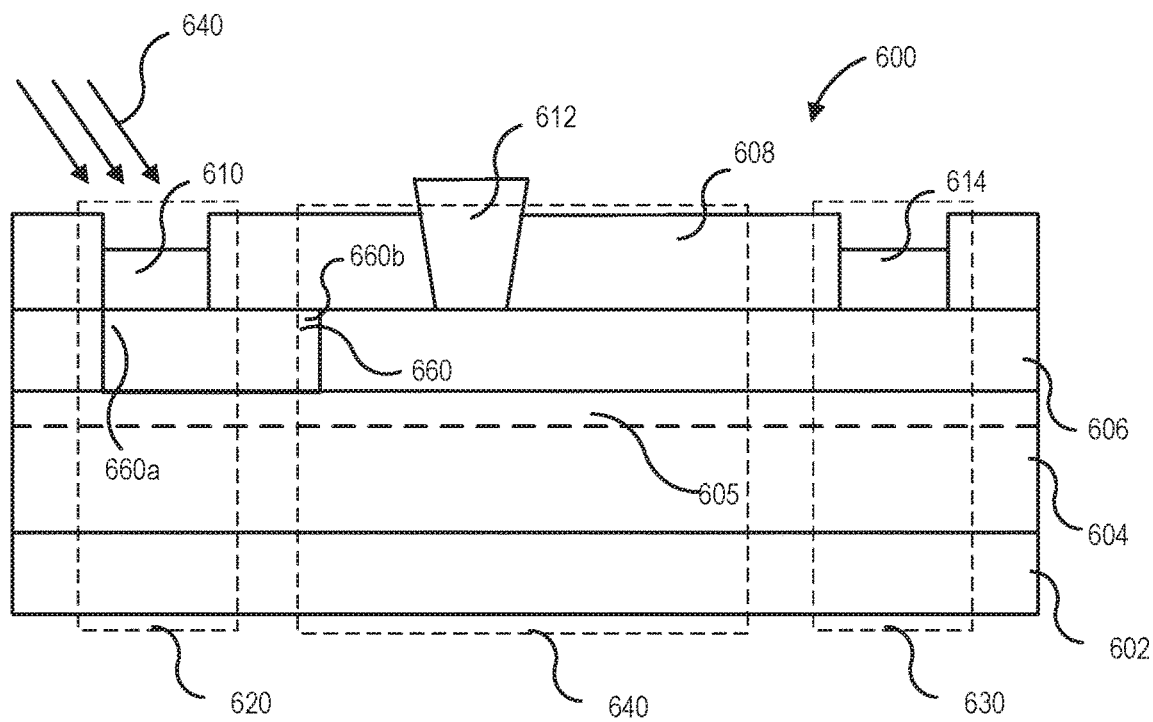
FIG. 12 is a schematic block diagram illustrating a cross section of a HEMT device including current dependent compensating source and drain resistance in accordance with some other embodiments of the present invention.

Reference is made to FIG. 12, which is a schematic block diagram illustrating a cross section of a HEMT device including current dependent compensating source resistance in accordance with some other embodiments of the present invention. FIG. 12 includes many elements discussed above in reference to FIG. 10 and thus will not be redundantly discussed. In contrast with FIG. 10 in which the source graded region 660 is formed in the barrier layer 606 to a partial depth, embodiments corresponding to FIG. 12 provide that the source graded region 660 may be formed to extend substantially all the way through the barrier layer 606. As provided above regarding FIGS. 10 and 11, the source graded region 660 may be formed using angularly directed implantation 640 or a straight (i.e., not angularly directed) implantation 641 that may be directed in a direction that is substantially orthogonal to the top surface of the substrate 602. Some embodiments provide the grading characteristic of the source graded region 660 may be achieved using a sloped implantation mask 642 region (FIG. 11). Although not illustrated, the upper surface of the source graded region 660 may not extend all the way to the upper surface of the barrier layer 606. In such embodiments, a portion of the barrier layer 606 may be between the source graded region 660 and the cap layer 608.

Figure 13:
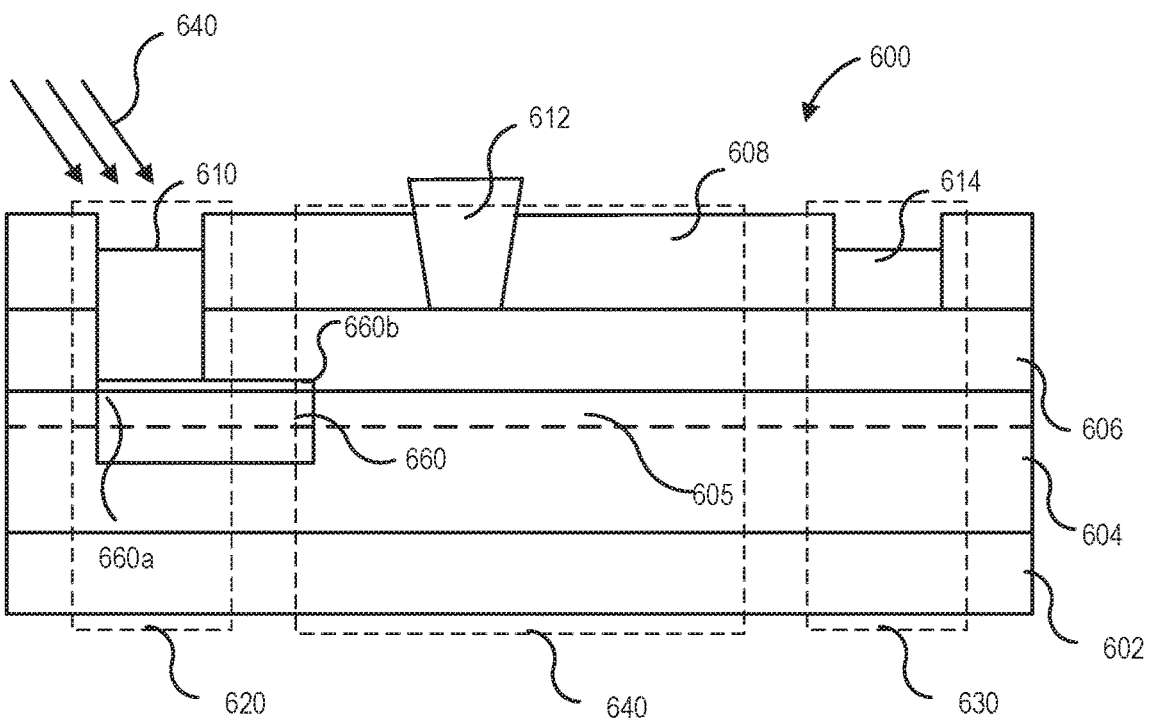
FIG. 13 is a schematic block diagram illustrating a cross section of a HEMT device including current dependent compensating source and drain resistance in accordance with some other embodiments of the present invention.

Reference is made to FIG. 13, which is a schematic block diagram illustrating a cross section of a HEMT device including current dependent compensating source resistance in accordance with some other embodiments of the present invention. FIG. 12 includes many elements discussed above in reference to FIG. 10 and thus will not be redundantly discussed. In contrast with FIG. 10 in which the source graded region 660 is formed in the barrier layer 606 to a partial depth, embodiments corresponding to FIG. 13 provide that the source graded region 660 may be formed in the channel layer 604 to a partial depth therein. In some embodiments, the source graded region 660 may include a portion that extends up into the barrier layer 606. Some embodiments provide the source graded region 660 includes an upper surface that is substantially coplanar with an interface between the channel layer 604 and the barrier layer 606.

As provided above regarding FIGS. 10 and 11, the source graded region 660 may be formed using angularly directed implantation 640 or a straight (i.e., not angularly directed) implantation 641 that may be directed in a direction that is substantially orthogonal to the top surface of the substrate 602. Some embodiments provide the grading characteristic of the source graded region 660 may be achieved using a sloped implantation mask 642 region (FIG. 11).

Figure 14:
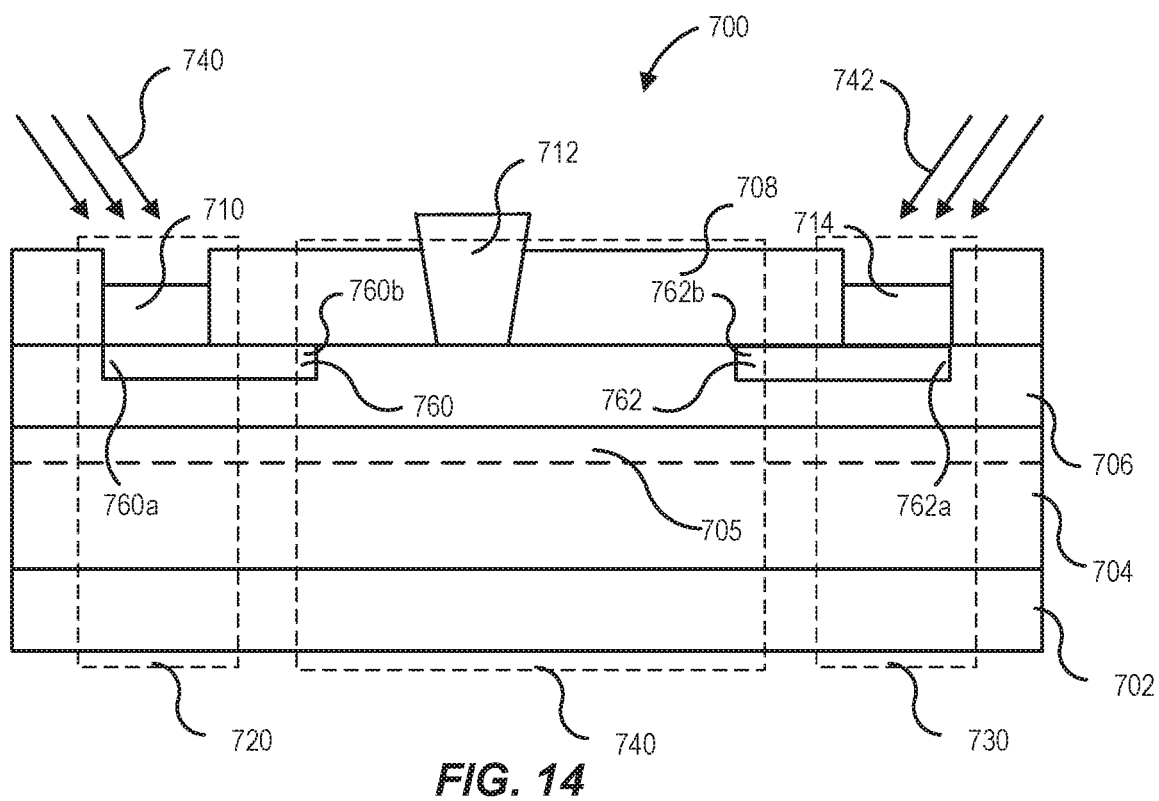
FIG. 14 is a schematic block diagram illustrating a cross section of a HEMT device including current dependent compensating source and drain resistance in accordance with some other embodiments of the present invention.

Reference is now made to FIG. 14, which is a schematic block diagram illustrating a cross section of a HEMT device including current dependent compensating source resistance in accordance with some other embodiments of the present invention. In some embodiments, the HEMT device 700 includes a substrate 702, which may, for example, include 4H—SiC or 6H—SiC. A channel layer 704 is formed on the substrate 702, and a barrier layer 706 is formed on the channel layer 704. The channel layer 704 and the barrier layer 706 may include Group III-nitride based materials, with the material of the barrier layer 706 having a higher bandgap than the material of the channel layer 704. For example, the channel layer 704 may comprise GaN, while the barrier layer 706 may comprise AlGaN, however, other materials may be used for the channel layer 704 and/or the barrier layer 706.

Due to the difference in bandgap between the barrier layer 706 and the channel layer 704 and piezoelectric effects at the interface between the barrier layer 706 and the channel layer 704, a two dimensional electron gas (2DEG) 705 is induced in the channel layer 704 at a junction between the channel layer 704 and the barrier layer 706. The 2DEG 705 is a highly conductive layer that allows conduction between a source region 720 and a drain region 730 of the device beneath the source electrode 710 and the drain electrode 714, respectively. A gate region 740 may be positioned between the source region 720 and the drain region 730. A drain electrode 714 may be formed on the barrier layer 706 in the drain region 730.

A cap layer 708 is formed on the substrate 702 on portions of the barrier layer 706. Some embodiments provide that the cap layer 708 includes recesses in which the source electrode 710, the drain electrode 714 and a gate electrode 712 may be formed. The cap layer 708 may include a dielectric material, such as SiN, $SiO_2$, etc.

Embodiments may include a source graded region 760 that is formed to be in the barrier layer 706 without extending completely through the barrier layer 706. The distance between the source graded region 760 and the 2DEG 705 may affect the current flow through the barrier layer 706. For example, lower values of source resistance at any given current may be provided by reducing the distance between the source graded region 760 and the channel layer 704. Stated differently, some embodiments provide that the current flowing through the barrier layer 706 may provide a compensating source resistance as the barrier layer 706 becomes increasingly forward biased. In some embodiments, the graded region 760 may be a laterally graded region having a dopant concentration that decreases laterally from the source region 710 to toward the gate contact 712.

Some embodiments provide that the source graded region 760 includes portions having different conductivity transition values from the source region 720 to a portion of the source graded region 760 extending beyond the source region 720 in the barrier layer 706. In some embodiments, the source graded region 760 includes silicon dopant ions that are implanted into the barrier layer 706 in the source region 720. Some embodiments provide the silicon may be implanted before the source electrode 710 is formed. Some embodiments provide that the source graded region 760 may include an n+ conductivity portion 760a in a portion of 760 that is below the source contact 710 in the source region 720 and may be graded to transition to an n− conductivity portion 760b in a portion of 660 that is closer to the gate contact 712. In some embodiments, the source graded region 760 may be formed by performing an angularly directed implantation 740. In this manner, the n+ conductivity portion 760a of the source graded region 760 may be formed in the source region 720 and the n− conductivity portion 760b of the source graded region 760 may extend into the barrier region 706 beyond the source region 720. As provided above, a separately formed the source ohmic structure may also be formed in the source region 720 and may be formed to include similar depth dimensional characteristics as the source graded region 760.

Embodiments may include a drain graded region 762 that is formed to be in the barrier layer 706 without extending completely through the barrier layer 706. The distance between the drain graded region 762 and the 2DEG 705 may affect the current flow through the barrier layer 706. For example, lower values of source resistance at any given current may be provided by reducing the distance between the drain graded region 762 and the channel layer 704. Stated differently, some embodiments provide that the current flowing through the barrier layer 706 may provide a compensating drain resistance as the barrier layer 706 becomes increasingly forward biased.

Some embodiments provide that the drain graded region 762 includes portions having different conductivity transition values from the drain region 730 to a portion of the drain graded region 762 extending beyond the drain region 730 in the barrier layer 706. In some embodiments, the drain graded region 762 includes silicon that is implanted into the barrier layer 706 in the source region 730. Some embodiments provide the silicon may be implanted before the drain electrode 714 is formed. Some embodiments provide that the drain graded region 762 may include an n+ conductivity portion 762a in the drain region 730 and may be graded to transition to an n− conductivity portion 762b. In some embodiments, the drain graded region 762 may be formed by performing an angularly directed implantation 742. In this manner, the n+ conductivity portion 762a of the drain graded region 762 may be formed in the drain region 730 and the n− conductivity portion 762b of the drain graded region 762 may extend into the barrier region 706 beyond the drain region 720. As provided above, a separately formed the drain ohmic structure may also be formed in the drain region 730 and may be formed to include similar depth dimensional characteristics as the source graded region 762.

As provided above regarding the source graded region 660, the drain graded region 762 may be formed using angularly directed implantation 742 or a straight (i.e., not angularly directed) implantation (not illustrated herein) that may be directed in a direction that is substantially orthogonal to the top surface of the substrate 702. Some embodiments provide the grading characteristic of the drain graded region 762 may be achieved using a sloped implantation mask region similar to the sloped implantation mask region 642.

Figure 15:
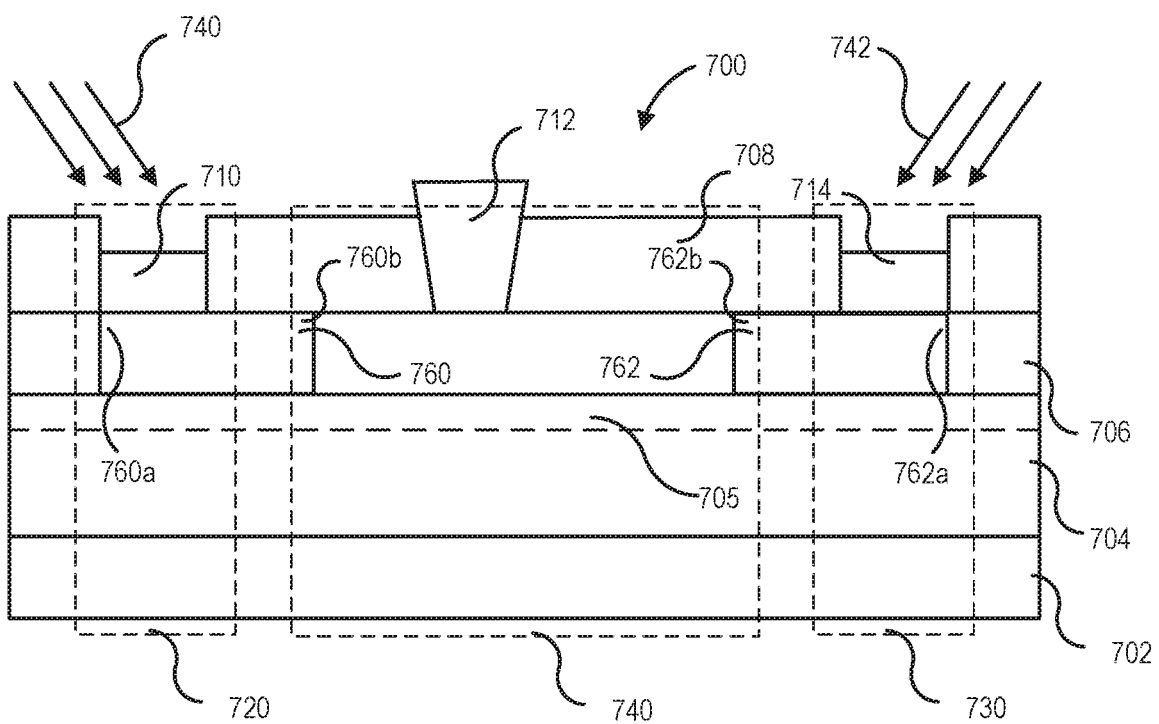
FIG. 15 is a schematic block diagram illustrating a cross section of a HEMT device including current dependent compensating source and drain resistance in accordance with some other embodiments of the present invention.

Reference is made to FIG. 15, which is a schematic block diagram illustrating a cross section of a HEMT device including current dependent compensating source resistance in accordance with some other embodiments of the present invention. FIG. 15 includes many elements discussed above in reference to FIG. 14 and thus will not be redundantly discussed. In contrast with FIG. 14 in which the source graded region 760 and the drain graded region 762 are formed in the barrier layer 706 to a partial depth, embodiments corresponding to FIG. 15 provide that the source graded region 760 and the drain graded region 762 may be formed to extend substantially all the way through the barrier layer 706. As provided above regarding FIG. 14, the source graded region 760 and the drain graded region 762 may be formed using angularly directed implantation 740, 742 or a straight (i.e., not angularly directed) implantation that may be directed in a direction that is substantially orthogonal to the top surface of the substrate 702. Some embodiments provide the grading characteristics of the source graded region 760 and the drain graded region 762 may be achieved using a sloped implantation mask. Although not illustrated, the upper surface of the source graded region 760 and the drain graded region 762 may not extend all the way to the upper surface of the barrier layer 706. In such embodiments, a portion of the barrier layer 706 may be between the source graded region 760 and the cap layer 708 and/or between the drain graded region 762 and the cap layer 708.

Figure 16:
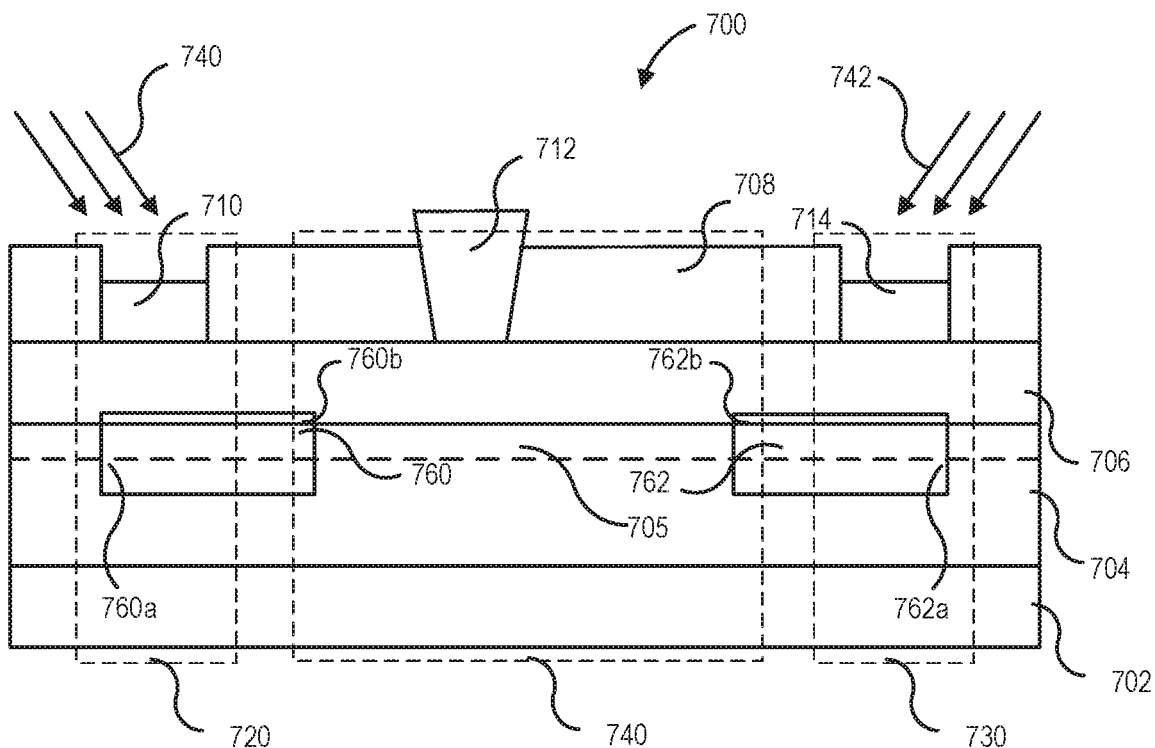
FIG. 16 is a schematic block diagram illustrating a cross section of a HEMT device including current dependent compensating source and drain resistance in accordance with some other embodiments of the present invention.

Reference is made to FIG. 16, which is a schematic block diagram illustrating a cross section of a HEMT device including current dependent compensating source resistance in accordance with some other embodiments of the present invention. FIG. 16 includes many elements discussed above in reference to FIG. 14 and thus will not be redundantly discussed. In contrast with FIG. 14 in which the source graded region 760 and the drain graded region 762 are formed in the barrier layer 706 to a partial depth, embodiments corresponding to FIG. 16 provide that the source graded region 760 and the drain graded region 762 may be formed in the channel layer 704 to a partial depth therein. In some embodiments, the source graded region 760 and the drain graded region 762 may each include a portion that extends up into the barrier layer 706. Some embodiments provide the source graded region 760 and the drain graded region 762 include an upper surface that is substantially coplanar with an interface between the channel layer 704 and the barrier layer 706.

Referring to FIGS. 14-16, the source graded region 760 and the drain graded region 762 are illustrated as having similar dimensional and positional characteristics. However, such illustrations are non-limiting as the source graded region 760 may have a different width, be formed at a different depth, be formed at a different thickness than and/or be formed in a different layer that the drain graded region 762. Additionally, the source graded region 760 and the drain graded region 762 may be doped using different implantation materials and/or processes.

Figure 17:
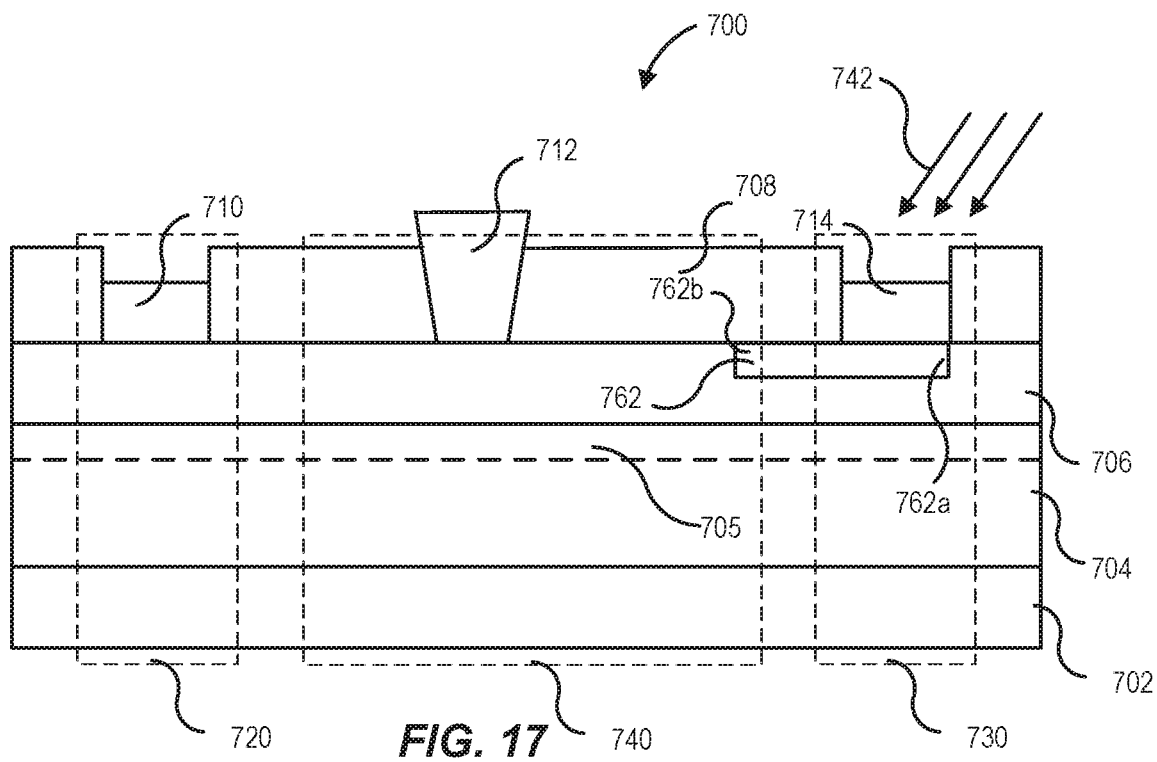
FIG. 17 is a schematic block diagram illustrating a cross section of a HEMT device including current dependent compensating source and drain resistance in accordance with some other embodiments of the present invention.

Reference is made to FIG. 17, which is a schematic block diagram illustrating a cross section of a HEMT device including current dependent compensating source resistance in accordance with some other embodiments of the present invention. FIG. 17 includes many elements discussed above in reference to FIG. 14 and thus will not be redundantly discussed. In contrast with FIG. 14, embodiments corresponding to FIG. 17 provide that there is no source graded region. As such, the drain graded region 762 is formed to be in the barrier layer 706 without extending completely through the barrier layer 706. The distance between the drain graded region 762 and the 2DEG 705 may control the current flow through the barrier layer 706. For example, lower values of source resistance at any given current may be provided by reducing the distance between the drain graded region 762 and the channel layer 704.

As provided above regarding FIG. 14, the drain graded region 762 may be formed using angularly directed implantation 742 or a straight (i.e., not angularly directed) implantation that may be directed in a direction that is substantially orthogonal to the top surface of the substrate 702.

Figure 18:
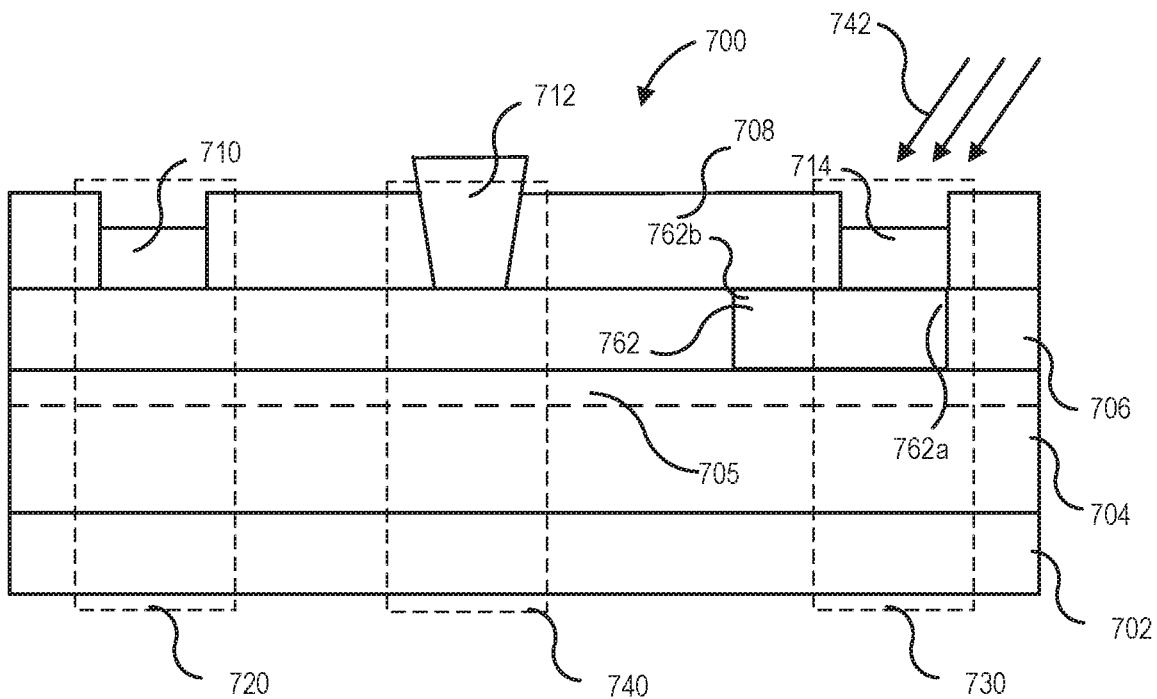
FIG. 18 is a schematic block diagram illustrating a cross section of a HEMT device including current dependent compensating source and drain resistance in accordance with some other embodiments of the present invention.

Reference is made to FIG. 18, which is a schematic block diagram illustrating a cross section of a HEMT device including current dependent compensating source resistance in accordance with some other embodiments of the present invention. FIG. 18 includes many elements discussed above in reference to FIGS. 14 and 17 and thus will not be redundantly discussed. In contrast with FIG. 17 in which the drain graded region 762 is formed in the barrier layer 706 to a partial depth, embodiments corresponding to FIG. 18 provide that the drain graded region 762 may be formed to extend substantially all the way through the barrier layer 706. As provided above regarding FIG. 17, the drain graded region 762 may be formed using angularly directed implantation 742 or a straight (i.e., not angularly directed) implantation that may be directed in a direction that is substantially orthogonal to the top surface of the substrate 702.

Figure 19:
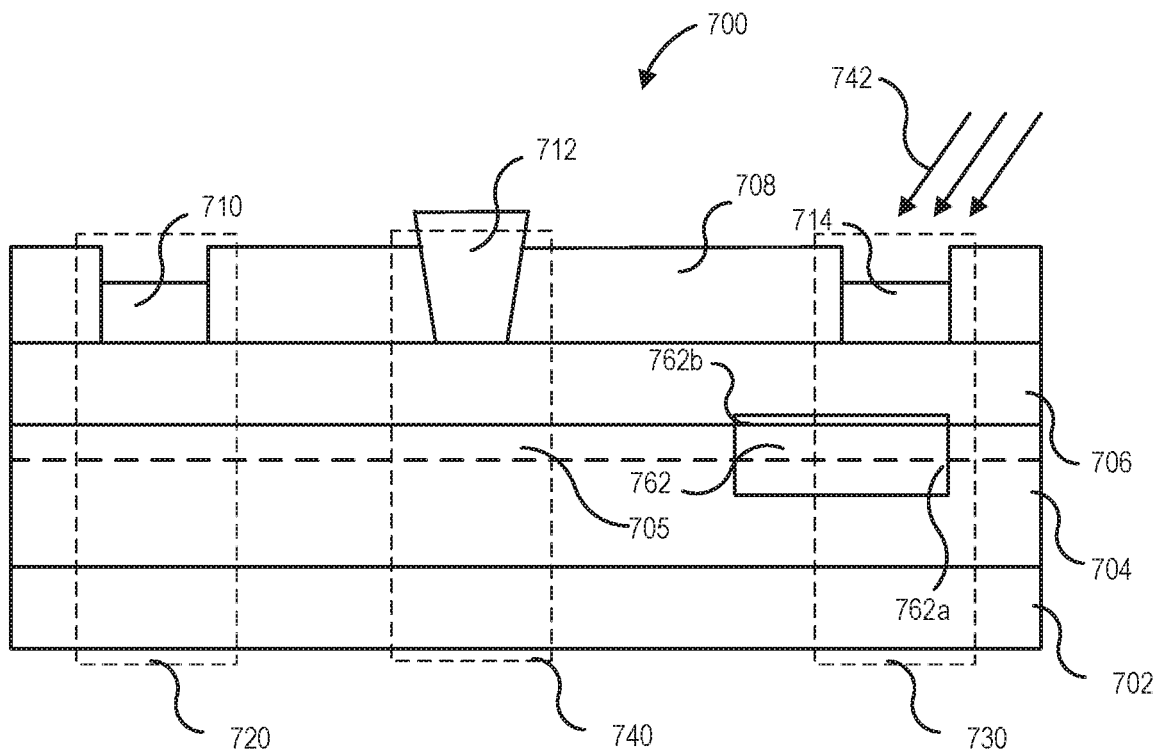
FIG. 19 is a schematic block diagram illustrating a cross section of a HEMT device including current dependent compensating source and drain resistance in accordance with some other embodiments of the present invention.

Reference is made to FIG. 19 which is a schematic block diagram illustrating a cross section of a HEMT device including current dependent compensating source resistance in accordance with some other embodiments of the present invention. FIG. 19 includes many elements discussed above in reference to FIGS. 14, 16 and 17 thus will not be redundantly discussed. In contrast with FIG. 17 in which the drain graded region 762 is formed in the barrier layer 706 to a partial depth, embodiments corresponding to FIG. 19 provide that the drain graded region 762 may be formed in the channel layer 704 to a partial depth therein. In some embodiments, the drain graded region 762 may include a portion that extends up into the barrier layer 706. Some embodiments provide the drain graded region 762 includes an upper surface that is substantially coplanar with an interface between the channel layer 704 and the barrier layer 706.

As provided herein, embodiments include source and/or drain graded regions that may be formed in the barrier and/or channel layers of a HEMT structure. In some embodiments, the source and/or drain graded regions may be implanted using implantation masks that may be removed after the implantation operations. Some embodiments provide that the implantation operations may be performed in barrier and/or channel layers that are covered with one or more cap layers that include channels etched therein. In some embodiments, etching may be performed partially or fully through a cap layer, a barrier layer and/or a channel layer before and/or after an implantation operation is performed.

Embodiments of the inventive concepts may be particularly well suited for use in connection with Group III-nitride based high electron mobility transistor (HEMT) devices. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. These compounds all have empirical formulas in which one mole of nitrogen is combined with a total of one mole of the Group III elements.

Suitable structures for GaN-based HEMTs that may utilize embodiments of the present invention are described, for example, in commonly assigned U.S. Publication No. 2002/0066908A1 published Jun. 6, 2002, for "Aluminum Gallium Nitride/Gallium Nitride High Electron Mobility Transistors Having A Gate Contact On A Gallium Nitride Based Cap Segment And Methods Of Fabricating Same," U.S. Publication No. 2002/0167023A1 for "Group-III Nitride Based High Electron Mobility Transistor (HEMT) With Barrier/Spacer Layer," published Nov. 14, 2002, U.S. Publication No. 2004/0061129 for "Nitride-Based Transistors And Methods Of Fabrication Thereof Using Non-Etched Contact Recesses," published on Apr. 1, 2004, U.S. Pat. No. 7,906,799 for "Nitride-Based Transistors With A Protective Layer And A Low-Damage Recess" issued Mar. 15, 2011, U.S. Pat. No. 6,316,793 entitled "Nitride Based Transistors On Semi-Insulating Silicon Carbide Substrates," issued Nov. 13, 2001, U.S. Pat. No. 7,812,369 entitled "Fabrication Of Single Or Multiple Gate Field Plates," issued Oct. 12, 2010, and U.S. Patent Publication No. 2014/0329367 for "Methods Of Fabricating Semiconductor Devices Including Implanted Regions For providing Low-Resistance Contact To Buried Layers And Related Devices" published Nov. 6, 2014, the disclosures of which are hereby incorporated herein by reference in their entirety.

In particular embodiments of the present invention, the substrate 102 may be a semi-insulating silicon carbide (SiC) substrate that may be, for example, 4H polytype of silicon carbide. Other silicon carbide candidate polytypes include the 3C, 6H, and 15R polytypes.

Finally, various embodiments described herein may be used with any depletion mode device, including but not limited to GaAs MESFETs and GaAs pHEMTs, in addition to GaN HEMTs. Various embodiments described herein are also not constrained to linear amplifiers. They can be used with non-linear amplifiers, as well.

Various embodiments have been described herein with reference to the accompanying drawings. It will be appreciated, however, that the inventive concepts may, however, be embodied in many different forms and should not be construed as limited to the embodiments set forth above. Rather, these embodiments are provided so that this disclosure will be thorough and complete, and will fully convey the scope of the inventive concepts to those skilled in the art. Like numbers refer to like elements throughout.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the present invention. The term "and/or" includes any and all combinations of one or more of the associated listed items.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" "comprising," "includes", "including", "have" and/or "having" and variants thereof when used herein, specify the presence of stated features, steps, operations, elements, and/or components, but do not preclude the presence or addition of one or more other features, steps, operations, elements, components, and/or groups thereof.

It will be understood that when an element such as a layer, region or substrate is referred to as being "on" or extending "onto" another element (and variants thereof), it can be directly on or extend directly onto the other element or intervening elements may also be present. In contrast, when an element is referred to as being "directly on" or extending "directly onto" another element (and variants thereof), there are no intervening elements present. It will also be understood that when an element is referred to as being "connected" or "coupled" to another element (and variants thereof), it can be directly connected or coupled to the other element or intervening elements may be present. In contrast, when an element is referred to as being "directly connected" or "directly coupled" to another element (and variants thereof), there are no intervening elements present.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the inventive concepts and, although specific terms are employed, they are used in a generic and descriptive sense only and not for purposes of limitation, the scope of the inventive concepts being set forth in the following claims.

What is claimed is:
1. A transistor device, comprising:
a channel layer;
a barrier layer on the channel layer, wherein the barrier layer and the channel layer induce a two dimensional electron gas in the channel layer at an interface between the channel layer and the barrier layer;
a drain electrode that is on the barrier layer in a drain region of the barrier layer;
a cap layer on the barrier layer; and
a source ohmic structure that is formed into a source region of the barrier layer and that is spaced apart from the drain electrode, wherein the source ohmic structure is within and overlapping a portion of the barrier layer; and a drain ohmic structure that is recessed into the drain region of the barrier layer, wherein the drain electrode is on the drain ohmic structure; and a graded region that is between a side surface of the source ohmic structure and the channel layer, wherein the graded region comprises a dopant concentration range from about $10^{14}$ atoms per cm$^3$ to about $10^{23}$ atoms per cm$^3$, wherein a dynamic drain resistance that increases as a drain current increases is offset by controlling a current through the barrier layer, and wherein the current through the barrier layer is controlled based on a distance between the drain ohmic structure and the two dimensional gas in the channel layer.

2. The transistor device of claim 1, wherein a dynamic source resistance that increases as a drain current increases is offset by controlling the current through the barrier layer.

3. The transistor device of claim 2, wherein the current through the barrier layer is controlled based on a distance between the source ohmic structure and the two dimensional gas in the channel layer.

4. The transistor device of claim 1, further comprising a gate electrode on the barrier layer and spaced apart from the drain electrode, wherein a portion of the barrier layer that is between the gate electrode and the source region is electrically insulated from the gate electrode.

5. The transistor device of claim 1, wherein the source ohmic structure comprises n+ conductivity.

6. The transistor device of claim 5, wherein the barrier layer comprises an AlGaN material and wherein the source ohmic structure includes silicon that is implanted into the barrier layer in the source region.

7. The transistor device of claim 5, wherein the graded region includes conductivity transition values between the n+ conductivity of the source ohmic structure to an n− conductivity of the channel layer.

8. The transistor device of claim 7, wherein the graded region is generated using an angular implantation during implantation of the source ohmic structure.

9. The transistor device of claim 1, wherein the source ohmic structure is partially recessed into the barrier layer and is spaced apart from the channel layer.

10. The transistor device of claim 1, wherein the source ohmic structure is recessed through the barrier layer and partially into the channel layer.

11. The transistor device of claim 1, wherein the source ohmic structure contacts the interface between the channel layer and the barrier layer.

12. The transistor device of claim 1, wherein an upper surface of the source ohmic structure is at substantially a same height as an upper surface of the barrier layer.

13. The transistor device of claim 1, further comprising a source electrode that is on the source ohmic structure.

14. The transistor device of claim 1, wherein the barrier layer includes a recess that is through the barrier layer in the source region, and wherein the source ohmic structure comprises a material that includes metal and contacts the channel layer at the interface between the channel layer and the barrier layer.

15. The transistor device of claim 14, wherein the source ohmic structure is annealed before a source electrode is formed.

16. The transistor device of claim 1, wherein the drain ohmic structure comprises n+ conductivity.

17. The transistor device of claim 16, wherein the barrier layer comprises an AlGaN material and wherein the drain ohmic structure includes silicon that is implanted into the barrier layer in the drain region.

18. The transistor device of claim 16, wherein the graded region includes conductivity transition values between the conductivity of the drain ohmic structure to a conductivity of the channel layer.

19. The transistor device of claim 18, wherein the graded region is generated using an angular implantation during implantation of the drain ohmic structure.

20. The transistor device of claim 1, further comprising a gate electrode on the barrier layer and spaced apart from the drain electrode, wherein a portion of the barrier layer that is between the gate electrode and the drain region is electrically insulated from the gate electrode.

21. The transistor device of claim 1, wherein the drain ohmic structure is partially recessed into the barrier layer and is spaced apart from the channel layer.

22. The transistor device of claim 1, wherein the drain ohmic structure is recessed through the barrier layer and partially into the channel layer.

23. The transistor device of claim 1, wherein the drain ohmic structure contacts the interface between the channel layer and the barrier layer.

24. The transistor device of claim 1, wherein an upper surface of the drain ohmic structure is at substantially a same height as an upper surface of the barrier layer.

25. The transistor device of claim 1, wherein the barrier layer includes a recess that is through the barrier layer in the drain region, and wherein the drain ohmic structure comprises a material that includes metal and contacts the channel layer at the interface between the channel layer and the barrier layer.

26. The transistor device of claim 25, wherein the drain ohmic structure is annealed before the drain electrode is formed.

27. A transistor device, comprising:

a substrate;

a channel layer on the substrate, the channel layer including a GaN material;

a barrier layer that is on the channel layer and that includes an AlGaN material;

a drain electrode that is on the barrier layer in a drain region of the device;

a source ohmic structure that is at least partially formed in the barrier layer in a source region of the device, wherein the source ohmic structure is within and overlapping a portion of the barrier layer;

a source electrode that is on the source ohmic structure;

a graded region that is between a side surface of the source ohmic structure and the channel layer, wherein the graded region comprises a dopant concentration range from about $10^{14}$ atoms per cm$^3$ to about $10^{23}$ atoms per cm$^3$; and a gate contact that is on the barrier layer and that is in a gate region of the device that is between the drain region and the source region, wherein a current through the barrier layer is controlled based on a distance between the source ohmic structure and the two dimensional-gas in the channel layer.

28. The transistor device of claim 27, wherein the barrier layer and the channel layer induce a two dimensional electron gas in the channel layer at an interface between the channel layer and the barrier layer, and wherein a dynamic source resistance that increases as a drain current increases is offset by controlling a current through the barrier layer.

29. The transistor device of claim 27, wherein the source ohmic structure includes silicon that is implanted into the barrier layer in the source region.

30. The transistor device of claim 29, wherein the source ohmic structure is partially recessed into the barrier layer and is spaced apart from the channel layer.

31. The transistor device of claim 29, wherein the source ohmic structure extends through the barrier layer and is partially recessed into the channel layer.

32. The transistor device of claim 27, wherein the barrier layer includes a recess that is through the barrier layer in the source region, and wherein the source electrode comprises a material that includes metal and contacts the channel layer at the interface between the channel layer and the barrier layer.

33. A transistor device comprising:
a channel layer;
a barrier layer on the channel layer, wherein the barrier layer and the channel layer induce a two-dimensional electron gas in the channel layer at an interface between the channel layer and the barrier layer;
an ohmic structure that is formed into a region of the barrier layer; and
a graded region that is between a side surface of the ohmic structure and the channel layer, wherein the graded region comprises a dopant concentration range from about $10^{14}$ atoms per $cm^3$ to about $10^{23}$ atoms per $cm^3$,
wherein the ohmic structure comprises a source ohmic structure in a source region of the barrier layer,
wherein the source ohmic structure is within and overlapping a portion of the barrier layer, and
wherein a current through the barrier layer is controlled based on a distance between the source ohmic structure and the two dimensional-gas in the channel layer.

34. The transistor device of claim 33,
wherein a dynamic source resistance that increases as a drain current increases is offset by controlling the current that flows through the barrier layer.

35. The transistor device of claim 33, wherein a combination of the compensating resistance and a device resistance comprises a substantially linear resistance.

36. The transistor device of claim 35, wherein the device resistance is substantially non-linear.

37. The transistor device of claim 33, wherein the current that flows through the barrier layer is controlled based on a distance between the ohmic structure and the interface between the channel layer and the barrier layer.

38. The transistor device of claim 37, wherein as the distance between the ohmic structure and the interface between the channel layer and the barrier layer is reduced, the current that flows through the barrier layer is reduced.

39. The transistor device of claim 33, wherein the current that flows through the barrier layer provides a compensating resistance responsive to the barrier layer becoming increasingly forward biased.

40. The transistor device of claim 33, wherein a portion of the barrier layer is between the ohmic structure and the channel layer.

41. The transistor device of claim 33, wherein the ohmic structure comprises a source ohmic structure in a source region of the barrier layer, the device further comprising a drain ohmic structure that is recessed into a drain region of the barrier layer.

42. The transistor device of claim 41, wherein a dynamic drain resistance that increases as a drain current increases is offset by controlling the current that flows through the barrier layer.

43. The transistor device of claim 41, wherein the drain ohmic structure is recessed through the barrier layer and partially into the channel layer.

44. The transistor device of claim 41, wherein an upper surface of the drain ohmic structure is at substantially a same height as an upper surface of the barrier layer.

45. A transistor device, comprising:
a channel layer;
a barrier layer on the channel layer, wherein the barrier layer and the channel layer induce a two dimensional electron gas in the channel layer at an interface between the channel layer and the barrier layer;
a drain electrode that is on the barrier layer in a drain region of the barrier layer;
a cap layer on the barrier layer; and
a source ohmic structure that is formed into a source region of the barrier layer and that is spaced apart from the drain electrode, wherein the source ohmic structure is within and overlapping a portion of the barrier layer without extending completely through the barrier layer and wherein the source ohmic structure comprises n+ conductivity; and
a drain ohmic structure that is recessed into the drain region of the barrier layer, wherein the drain electrode is on the drain ohmic structure; and
a graded region that is between a side surface of the source ohmic structure and the channel layer, the graded region including conductivity transition values between the n+ conductivity of the source ohmic structure to an n− conductivity of the channel layer,
wherein a dynamic drain resistance that increases as a drain current increases is offset by controlling a current through the barrier layer, and
wherein the current through the barrier layer is controlled based on a distance between the drain ohmic structure and the two dimensional gas in the channel layer.

46. A transistor device, comprising:
a channel layer;
a barrier layer on the channel layer, wherein the barrier layer and the channel layer induce a two dimensional electron gas in the channel layer at an interface between the channel layer and the barrier layer;
a drain electrode that is on the barrier layer in a drain region of the barrier layer;
a cap layer on the barrier layer; and
a source ohmic structure that is formed into a source region of the barrier layer and that is spaced apart from the drain electrode, wherein the source ohmic structure is within and overlapping a portion of the barrier layer; and
a drain ohmic structure that is recessed into the drain region of the barrier layer without extending completely through the barrier layer, wherein the drain electrode is on the drain ohmic structure; and
a graded region that is between a side surface of the drain ohmic structure and the channel layer, the graded region including conductivity transition values between the conductivity of the drain ohmic structure to a conductivity of the channel layer,
wherein a dynamic drain resistance that increases as a drain current increases is offset by controlling a current through the barrier layer, and
wherein the current through the barrier layer is controlled based on a distance between the drain ohmic structure and the two dimensional gas in the channel layer.

\* \* \* \* \*